(12) United States Patent
Katsura et al.

(10) Patent No.: US 10,553,558 B2
(45) Date of Patent: Feb. 4, 2020

(54) SEMICONDUCTOR DEVICE

(71) Applicant: Renesas Electronics Corporation, Tokyo (JP)

(72) Inventors: Yosuke Katsura, Gunma (JP); Yusuke Tanuma, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/220,438

(22) Filed: Jul. 27, 2016

(65) Prior Publication Data

US 2017/0053846 A1 Feb. 23, 2017

(30) Foreign Application Priority Data

Aug. 21, 2015 (JP) ................................. 2015-163959

(51) Int. Cl.

| | |
|---|---|
| *H01L 23/18* | (2006.01) |
| *H01L 21/48* | (2006.01) |
| *H01L 21/56* | (2006.01) |
| *H01L 23/00* | (2006.01) |
| *H01L 23/31* | (2006.01) |
| *H01L 25/065* | (2006.01) |
| *H01L 25/18* | (2006.01) |

(52) U.S. Cl.
CPC ...... *H01L 25/0655* (2013.01); *H01L 21/4853* (2013.01); *H01L 21/563* (2013.01); *H01L 25/18* (2013.01); *H01L 24/16* (2013.01); *H01L 2224/16227* (2013.01); *H01L 2924/1431* (2013.01); *H01L 2924/1436* (2013.01)

(58) Field of Classification Search
None
See application file for complete search history.

(56) References Cited

U.S. PATENT DOCUMENTS

| | | | |
|---|---|---|---|
| 6,853,089 B2 | 2/2005 | Ujiie et al. | |
| 2003/0052419 A1 | 3/2003 | Ujiie et al. | |
| 2006/0281230 A1* | 12/2006 | Brandenburg | ...... H01L 23/3121 438/127 |
| 2008/0081401 A1 | 4/2008 | Shizuno | |

(Continued)

FOREIGN PATENT DOCUMENTS

| | | |
|---|---|---|
| JP | 52-164452 U | 12/1977 |
| JP | 2003-092374 A | 3/2003 |

(Continued)

OTHER PUBLICATIONS

Japanese Office Action received in corresponding Japanese Application No. 2015-163959 dated Apr. 9, 2019.

(Continued)

*Primary Examiner* — Khaja Ahmad

(74) *Attorney, Agent, or Firm* — Mattingly & Malur, PC

(57) ABSTRACT

A semiconductor device includes a memory component, which is a semiconductor component (a semiconductor chip or a semiconductor package), to be mounted over an upper surface of a wiring substrate. In addition, in the upper surface, a distance between the memory component and a first substrate side of the upper surface is smaller than a distance between the memory component and a second substrate side of the upper surface. In addition, in the upper surface, a dam portion is formed between the memory component and the first substrate side.

7 Claims, 21 Drawing Sheets

(56) References Cited

U.S. PATENT DOCUMENTS

| | | |
|---|---|---|
| 2008/0111249 A1 | 5/2008 | Miyazaki |
| 2008/0237895 A1 | 10/2008 | Saeki |
| 2009/0236686 A1* | 9/2009 | Shim, II ............... H01L 21/568 257/528 |
| 2010/0078791 A1 | 4/2010 | Yim et al. |
| 2010/0116534 A1 | 5/2010 | Choi et al. |
| 2010/0320577 A1* | 12/2010 | Pagaila ............... H01L 21/565 257/659 |
| 2011/0115083 A1* | 5/2011 | Zang ................... H01L 21/563 257/738 |
| 2011/0215444 A1* | 9/2011 | Park ..................... H01L 23/48 257/629 |
| 2013/0161776 A1* | 6/2013 | Iizuka ................. H01L 31/0203 257/433 |
| 2014/0252634 A1* | 9/2014 | Hung ................... H01L 23/48 257/773 |
| 2014/0327138 A1 | 11/2014 | Miyamoto |

FOREIGN PATENT DOCUMENTS

| | | |
|---|---|---|
| JP | 2008-91529 A | 4/2008 |
| JP | 2008-124140 A | 5/2008 |
| JP | 2008-252026 A | 10/2008 |
| JP | 2010-87516 A | 4/2010 |
| JP | 2010-118634 A | 5/2010 |
| JP | 2012-195615 A | 10/2012 |
| JP | 2013-131552 A | 7/2013 |
| JP | 2013-131714 A | 7/2013 |
| JP | 2014-220278 A | 11/2014 |

OTHER PUBLICATIONS

Japanese Office Action received in corresponding Japanese Application No. 2015-163959 dated Dec. 11, 2018.

Chinese Office Action received in corresponding Chinese Application No. 201610693914.X dated Nov. 28, 2019.

\* cited by examiner

SEMICONDUCTOR DEVICE

CROSS-REFERENCE TO RELATED APPLICATION

The present application claims priority from Japanese Patent Application No. 2015-163959 filed on Aug. 21, 2015, the content of which is hereby incorporated by reference into this application.

TECHNICAL FIELD OF THE INVENTION

The present invention relates to a semiconductor device, and for example, a semiconductor device including a wiring substrate having a dam portion.

BACKGROUND OF THE INVENTION

Japanese Patent Application Laid-Open Publication No. 2003-92374 (Patent Document 1) and U.S. Pat. No. 6,853, 089 (Patent Document 2) describe that a groove is formed between a semiconductor chip to be mounted over a wiring substrate and an electrode formed on a main surface of the wiring substrate to suppress flow-out of an adhesive.

SUMMARY OF THE INVENTION

The wiring substrate is a wiring material which is electrically connected to a plurality of electronic components including a semiconductor component, and electrically connects these electronic components to each other to operate a circuit. Thus, an electrode provided in the semiconductor component is electrically connected to a terminal provided in the wiring substrate when the semiconductor component is mounted over the wiring substrate. Further, it is preferable to seal a connection portion with, for example, resin or the like, in order to protect the connection portion that electrically connects the electrode of the semiconductor component and the terminal of the wiring substrate.

Meanwhile, the semiconductor component is mounted at various locations in a component mounting surface of the wiring substrate in accordance with various specifications of the semiconductor device. Accordingly, it is also possible that a semiconductor component is mounted to be close to a peripheral edge of the component mounting surface of the wiring substrate depending on the specification of the semiconductor device.

Meanwhile, there is a case in which the resin to seal the connection portion spreads to the peripheral edge of the component mounting surface or beyond the peripheral edge of the component mounting surface when the semiconductor component is mounted to be close to the peripheral edge of the component mounting surface.

Accordingly, it is preferable to provide a dam portion (for example, a wall or a groove), which stops the flow of the resin, in the vicinity of a component mounting region of the wiring substrate. In this manner, even when some of the resin disposed in this component mounting region (or a resin disposition region) overflows into an outer side of the component mounting region, it is possible to prevent this overflow resin from flowing out to the peripheral edge of the component mounting surface.

However, there are various layouts of the semiconductor component and various specifications of the semiconductor device, as described above. Thus, it is preferable to consider such points at the time of providing the above-described dam portion in the wiring substrate.

The above and other objects and novel characteristics of the present invention will be apparent from the description of the present specification and the accompanying drawings.

A semiconductor device according to one embodiment of the present invention includes a semiconductor component mounted over a first surface of a wiring substrate. In the first surface, a distance between the semiconductor component and a first side of the first surface is smaller than a distance between the semiconductor component and a second side of the first surface, in the first surface. In addition, in the first surface, a dam portion is formed between the semiconductor component and the first side.

According to one embodiment of the present invention, it is possible to improve reliability of a semiconductor device.

BRIEF DESCRIPTIONS OF THE DRAWINGS

Figure 1:
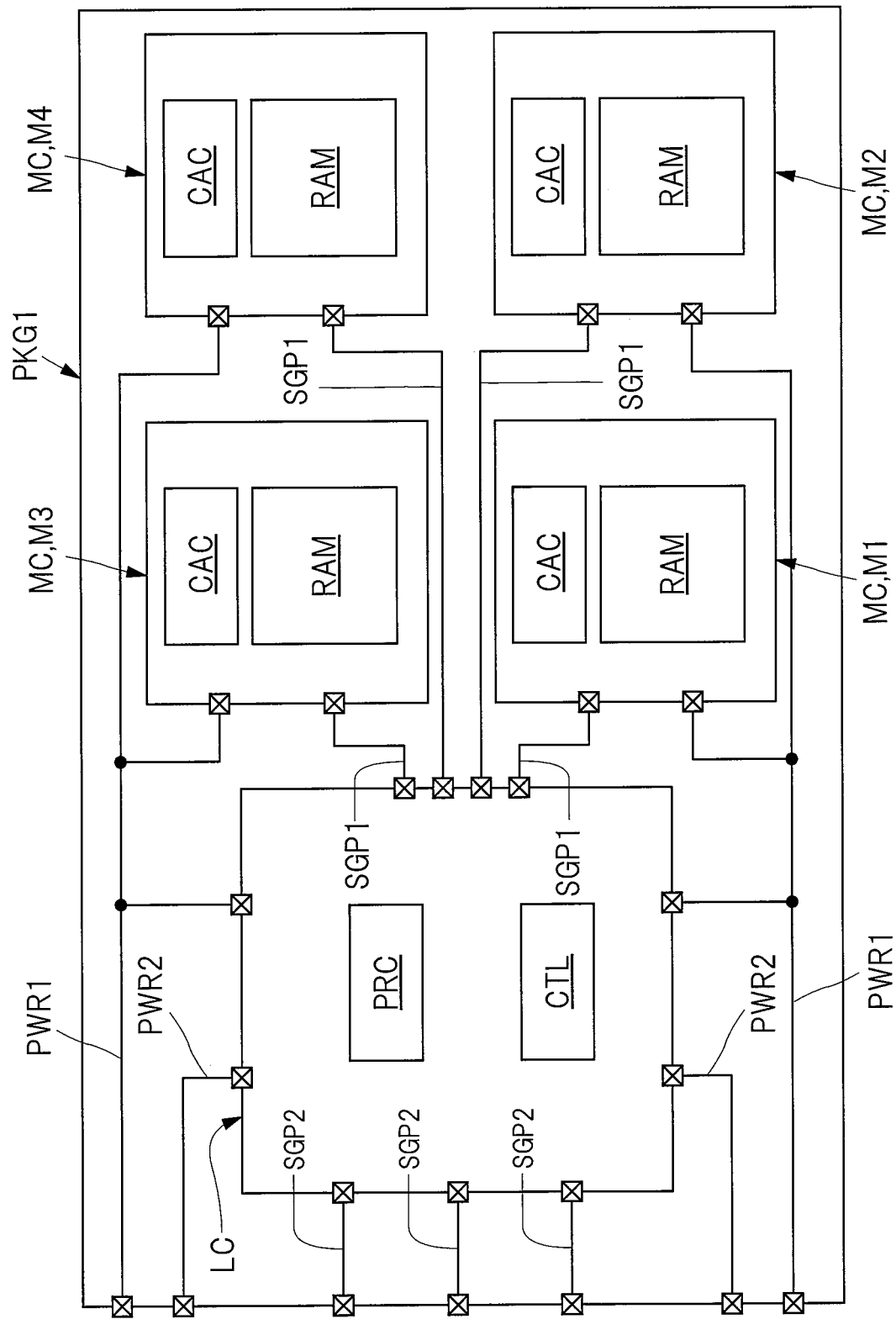
FIG. 1 is an explanatory diagram illustrating a configuration example of a circuit included in a semiconductor device according to one embodiment.

DESCRIPTIONS OF THE PREFERRED EMBODIMENTS (Explanations of Description Manner, Basic Terms, Usage in Present Application)

In the present application, the embodiments are described in a plurality of sections or others when required as a matter of convenience. However, these sections or others are not independent from each other unless otherwise stated, and the one in each portion of single example relates to the entire, a part, or a partial detail of the other as a modification example or others regardless of the described context. Also, in principle, the repetitive description of the similar portions is omitted. Further, the number of each element in the embodiments is not always limited to a specific number unless otherwise stated or except the case where the number is logically limited to the specific number or except the case where the number is apparently not the specific number from the context.

Similarly, in the description of the embodiments or others, when "X formed of A" is described for a material, composition, or others, the one containing other components than A is not eliminated unless otherwise stated or except the case where it is apparently not so. For example, when a component is described, it means such as "X containing A as a principal component". For example, even when a "silicon member" or others is described, it goes without saying that it includes not only pure silicon but also SiGe (silicon germanium) alloy, multi metal alloy containing other silicon as the principal component, and a member containing other additives or others. In addition, even when gold plating, Cu layer, nickel plating, and others are described, they include not only pure materials but also a member containing gold, Cu, nickel, and others as the principal component, respectively, unless otherwise stated or except the case where they are apparently not so.

Still further, even when referring to the specified number or amount, the number may be larger or smaller than the specified number unless otherwise stated, except the case where the number is logically limited to the specified number, or except the case where it is apparently not so from the context.

Moreover, the same or similar components are denoted by the same or similar reference symbols or reference numbers throughout each drawing of the embodiments, and the repetitive description thereof will be omitted in principle.

In addition, in accompanying drawings, hatching or others may be omitted even in a cross section in the case that the drawing is adversely complicated or the case that a portion is distinct from an empty space. In this regard, an outline of background is omitted even in a closed hole in a plan view in some cases such that it is clear from explanations or others. Further, even not in the cross-sectional surface, hatching or dot pattern may be added in order to clarify that it is not the empty space, or in order to clearly illustrate a boundary of regions.

In addition, a semiconductor device, which is obtained by forming an integrated circuit in a semiconductor substrate made of, for example, silicon (Si) or the like, and then, dividing the resultant into a plurality of individual pieces, will be referred to as a semiconductor chip in this application. In addition, a semiconductor device, including the semiconductor chip, a base material (for example, a wiring substrate or a lead frame) over which the semiconductor chip is mounted, and a plurality of external terminals electrically connected to the semiconductor chip, will be referred to as a semiconductor package. In addition, there is a case in which the semiconductor chip and the semiconductor package are referred to as the semiconductor component or the semiconductor device. The semiconductor component or the semiconductor device is a general term of the semiconductor chip and the semiconductor package. In addition, the semiconductor component or the semiconductor device also includes the one in which a plurality of semiconductor components are mounted over a base material such as a wiring substrate. For example, the one in which a plurality of semiconductor components are mounted over a wiring substrate will be referred to as the semiconductor device in the following embodiment. Accordingly, the semiconductor component means the semiconductor chip or the semiconductor package in the following embodiment.

<Circuit Configuration Example of Semiconductor Device>

First, a circuit configuration example of a semiconductor device PKG1 will be described, and then, a structure of the semiconductor device PKG1 will be described. FIG. 1 is an explanatory diagram illustrating a configuration example of a circuit included in a semiconductor device of the present embodiment.

Incidentally, FIG. 1 illustrates a control circuit CTL, which controls an operation of a memory circuit RAM provided in a memory component MC, and an arithmetic processing circuit PRC which performs arithmetic processing, for example, an image display system or the like, as representative examples among a plurality of circuits included in a logic component LC. In addition, FIG. 1 representatively illustrates an input and output circuit CAC which performs an input and output operation of a data signal, and the memory circuit RAM which stores a data signal, among a plurality of circuits included in the memory component MC. In addition, FIG. 1 representatively illustrates some of multiple wiring paths (signal transmission paths and power supply paths) for convenience of viewing.

As illustrated in FIG. 1, the semiconductor device PKG1 according to the present embodiment includes a wiring substrate 10, and a plurality of semiconductor components mounted over an upper surface 10t of the wiring substrate 10. In the example illustrated in FIG. 1, the plurality of semiconductor components are configured of the two memory components MC (memory components M1 and M2) including a storage circuit (memory circuit) formed therein, and the logic component LC provided with a control circuit to control each operation of the four memory components MC. Incidentally, the number of the plurality of semiconductor components is not limited to the above description, and various types of modification examples can be applied. In particular, a required storage capacity is different depending on a system provided in the semiconductor device PKG1 in terms of the number of the memory components MC. Since a value of the storage capacity increases in proportion to the number of the memory components MC, the number of the memory components MC may be one or more, for example. In addition, a plurality of the logic components LC may be mounted over the upper surface 10t. In addition, a semiconductor component provided with a function other than the logic component LC and the memory component MC may be mounted. Further, a single semiconductor component between the memory component MC and the logic component LC may be mounted.

Each of the plurality of memory components MC illustrated in FIG. 1 is provided with a storage circuit (hereinafter, it will be described as the memory circuit RAM) which is referred to as a dynamic random access memory (DRAM), and the input and output circuit CAC which performs an input and output operation of the data signal with respect to the memory circuit RAM. In addition, the logic component LC, which is electrically connected to each of the plurality of memory components MC, is provided with the control circuit CTL which controls an operation of the memory circuit RAM of the memory component MC, and the arithmetic processing circuit PRC which performs the arithmetic processing with respect to the data signal.

In addition, a plurality of signal transmission paths SGP1 are connected to each of the plurality of memory components MC to transmit an electrical signal with respect to the logic component LC. The plurality of signal transmission paths SGP1 include, for example, a data signal transmission path which transmits a data signal, a clock signal transmission path which transmits a clock signal to make an operation timing synchronized, and a control signal transmission path which transmits a control signal to control the input and output operation (including a read operation and a write operation). Each of the plurality of signal transmission paths SGP1 is connected to the logic component LC.

In addition, a power supply path PWR1, which supplies power to drive the input and output circuit CAC or the memory circuit RAM, is connected to each of the plurality of memory components MC. The power supply path PWR1 includes a path which supplies a power source potential and a path which supplies a reference potential. Incidentally, when drive voltages of the input and output circuit CAC and the memory circuit RAM are different from each other, a plurality of the power supply paths PWR1 which supply different power source potentials may be connected to the plurality of memory components MC, respectively.

In addition, the plurality of signal transmission paths SGP1 are connected to the logic component LC to transmit an electrical signal with respect to each of the plurality of memory components MC. The plurality of signal transmission paths SGP1 include a data signal transmission path which transmits a data signal, a clock signal transmission path which transmits a clock signal to make the operation timing synchronized, and a control signal transmission path which transmits a control signal to control the input and output operation, with respect to the memory component MC.

In addition, a plurality of signal transmission paths SGP2 are connected to the logic component LC to transmit an electrical signal with respect to external equipment of the semiconductor device PKG1. The signal transmission path SGP2 includes, for example, a data signal transmission path which transmits a data signal with respect to the external equipment, a clock signal transmission path which transmits a clock signal to make an operation timing synchronized, and a control signal transmission path which transmits a control signal to control an operation of a circuit provided in the external equipment or the logic component LC.

In addition, a power supply path PWR2, which supplies power to drive the arithmetic processing circuit PRC or the control circuit CTL, is connected to the logic component LC. In addition, the power supply path PWR1, which supplies power to drive a circuit that controls the input and output operation of the memory component MC, is connected to the logic component LC. The power supply path PWR1 and the power supply path PWR2 include the path which supplies a power source potential and the path which supplies a reference potential. Incidentally, the logic component LC is provided with the plurality of circuits. When voltages required by the plurality of circuits, provided in the logic component LC, are different from each other, a plurality of the power supply paths PWR1 and PWR2 which supply different power source potentials may be connected to the logic component LC.

As described above, the signal transmission path SGP2 which is connected to the external equipment is also connected to the logic component LC, as with the signal transmission path SGP1 which is connected to the memory component MC. Thus, a larger number of wirings are densely formed in the perimeter of the logic component LC as compared to the perimeter of the memory component MC, which will be described later.

<Structure of Semiconductor Device>

Figure 2:
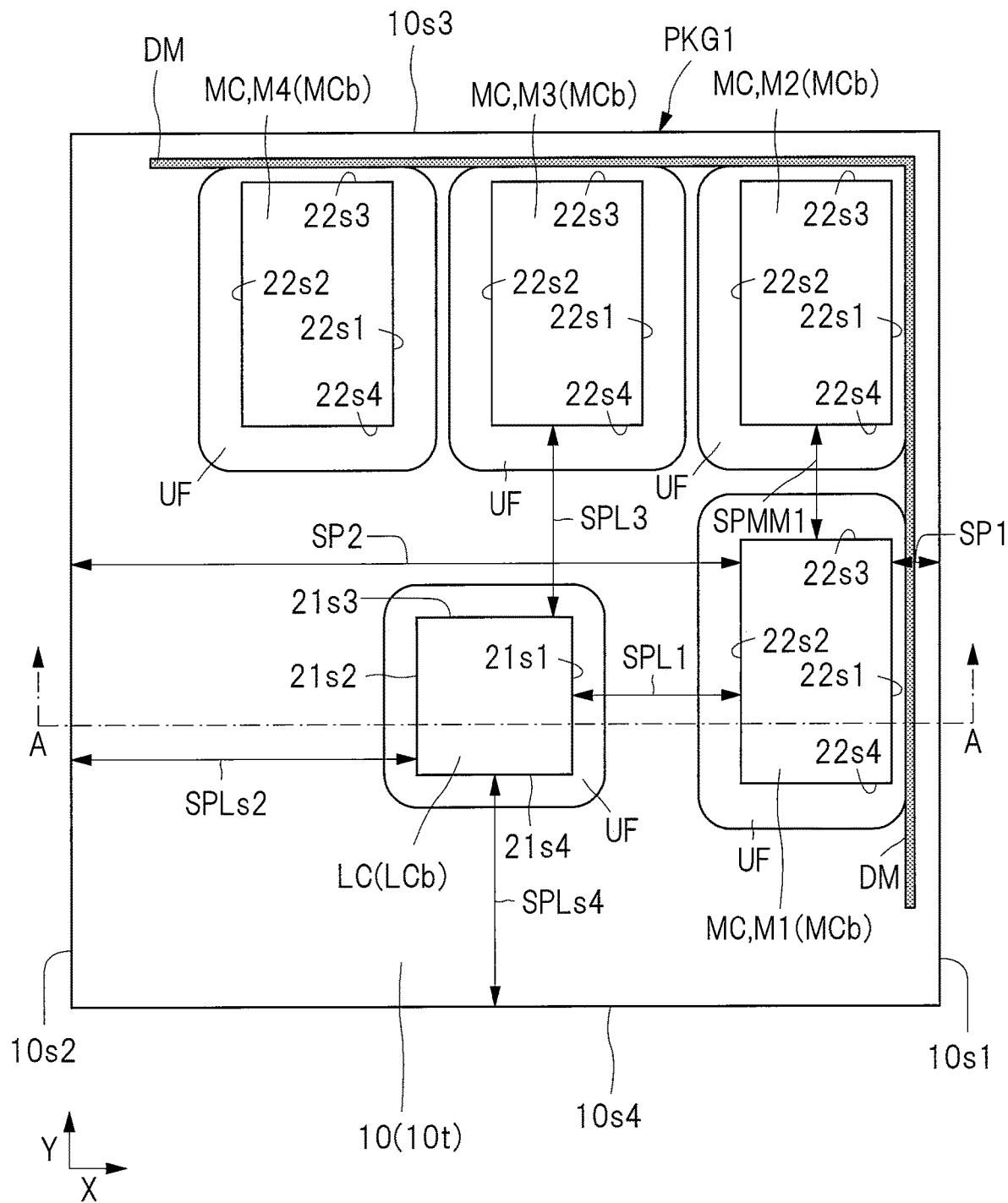
FIG. 2 is a plan view of a component mounting surface side of the semiconductor device illustrated in FIG. 1.
Figure 3:
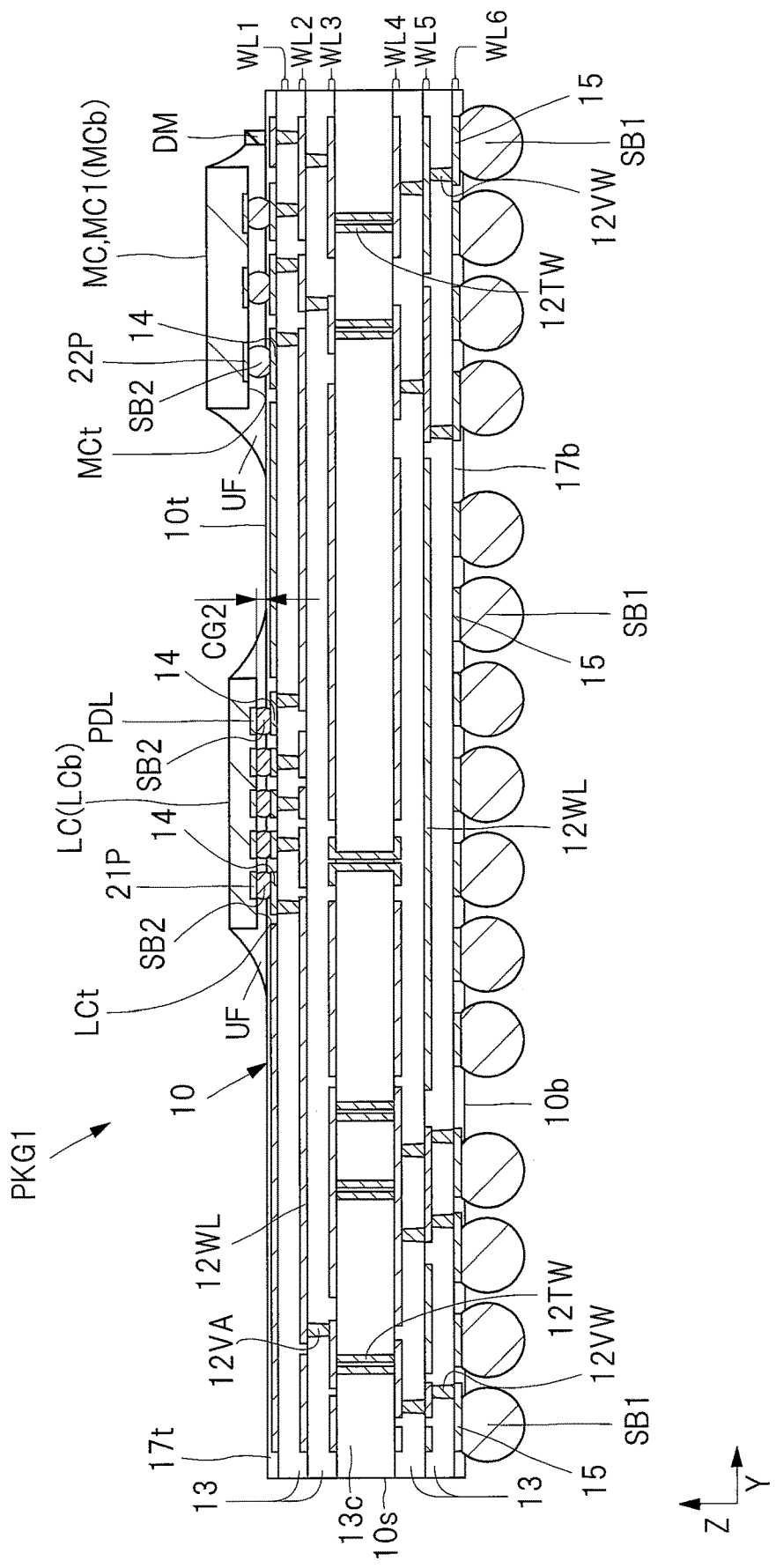
FIG. 3 is a cross-sectional view taken along a line A-A of the semiconductor device illustrated in FIG. 2.
Figure 4:
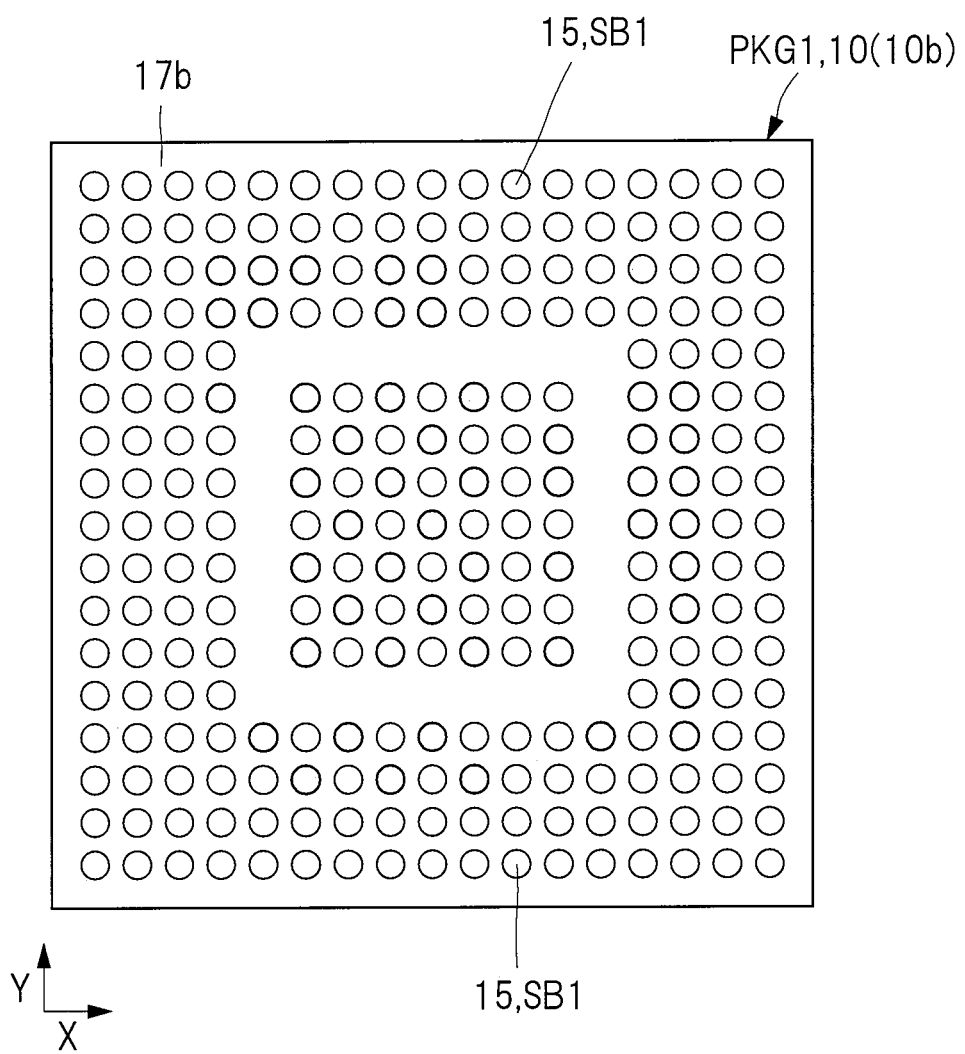
FIG. 4 is a plan view illustrating a structure of a lower surface side of the semiconductor device illustrated in FIG. 2.
Figure 5:
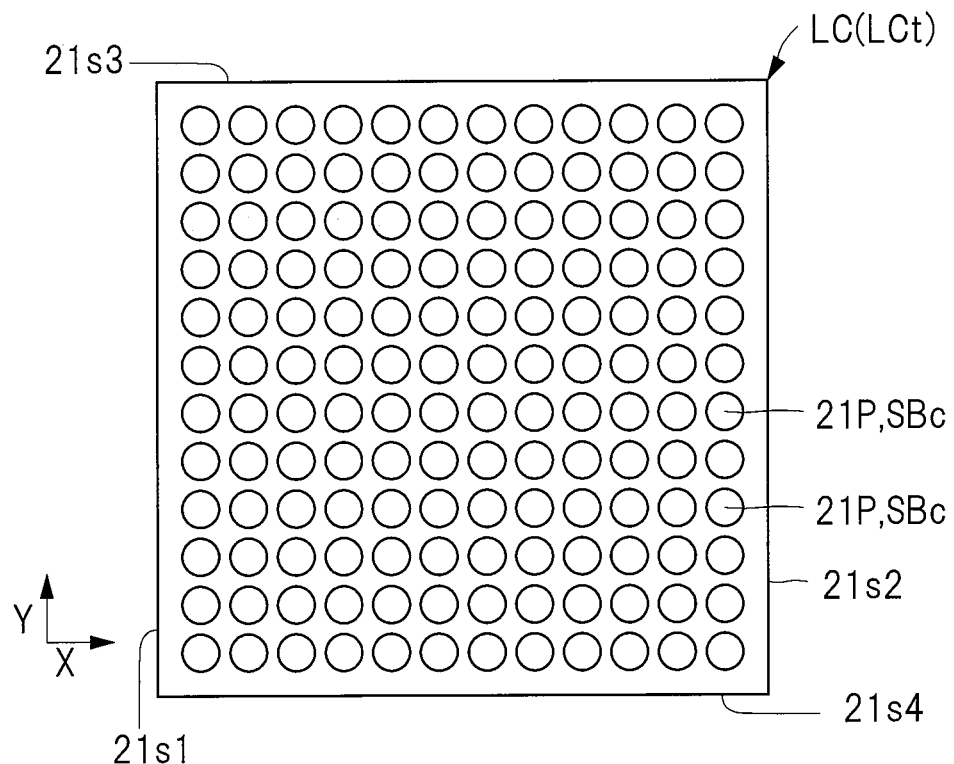
FIG. 5 is a plan view of a front surface side of a logic component illustrated in FIG. 2.
Figure 6:
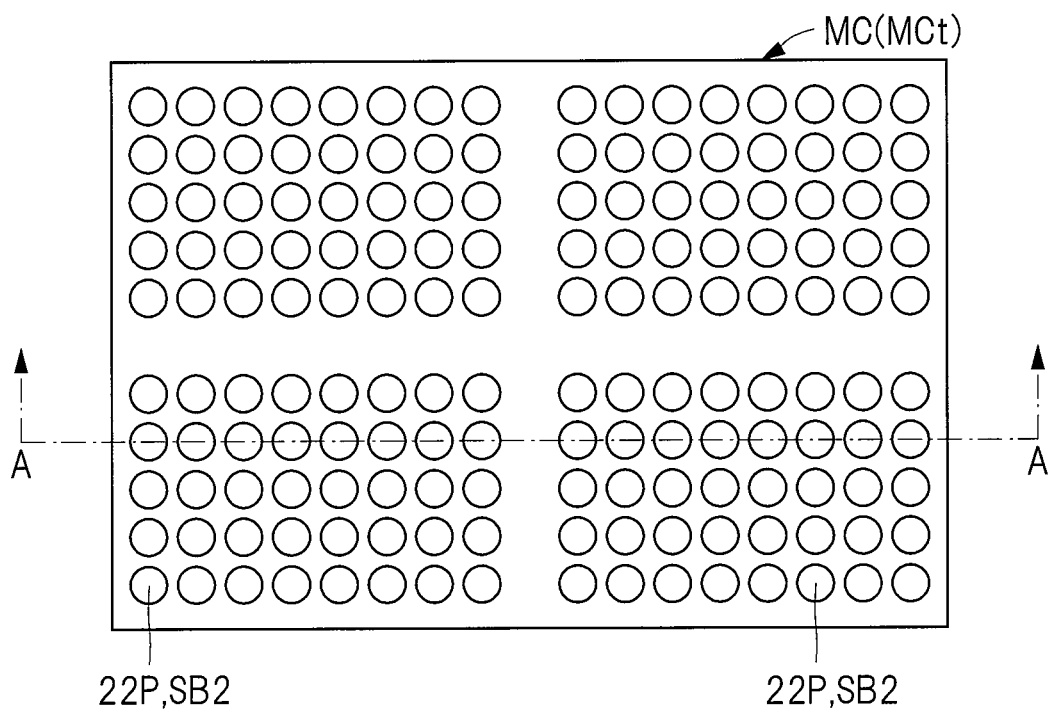
FIG. 6 is a plan view of a front surface side of a memory component illustrated in FIG. 2.
Figure 7:
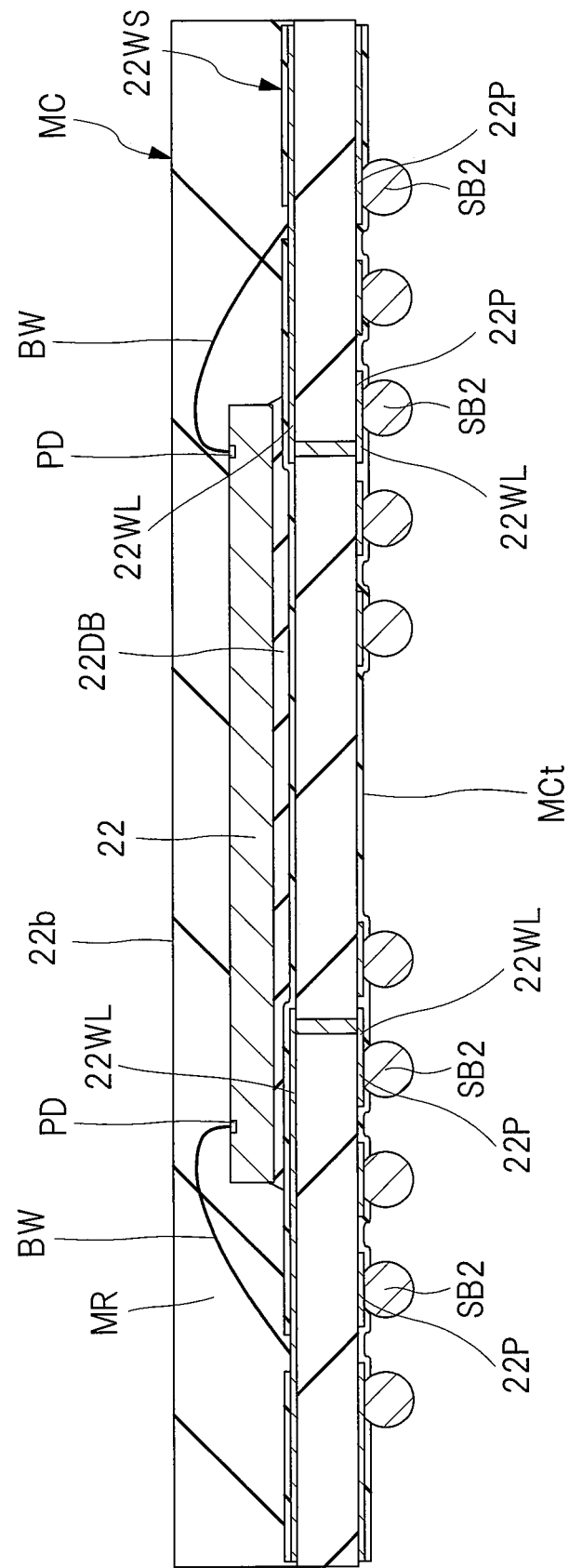
FIG. 7 is a cross-sectional view taken along a line A-A of FIG. 6.

Next, a description will be given regarding a structure of the semiconductor device PKG1 illustrated in FIG. 1. FIG. 2 is a plan view of a component mounting surface side of the semiconductor device illustrated in FIG. 1. FIG. 3 is a cross-sectional view taken along a line A-A of the semiconductor device illustrated in FIG. 2. In addition, FIG. 4 is a plan view illustrating a structure of a lower surface side of the semiconductor device illustrated in FIG. 2. In addition, FIG. 5 is a plan view of a front surface side of a logic component illustrated in FIG. 2. In addition, FIG. 6 is a plan view of a front surface side of a memory component illustrated in FIG. 2. In addition, FIG. 7 is a cross-sectional view taken along a line A-A of FIG. 6.

Although FIG. 2 is the plan view, a dam portion DM is illustrated with a pattern in order for easy understanding of a location of the dam portion DM provided in a peripheral edge portion of the wiring substrate 10. The dam portion DM will be illustrated with the same pattern also in the following plan views. In addition, FIG. 3 is the cross-sectional view, but hatching is omitted in an insulating layer 13, an insulating film 17t, an insulating film 17b, and a resin UF in order for convenience of viewing of the drawing. In addition, the number of electrodes is reduced and illustrated in FIGS. 3 and 7 for convenience of viewing. Thus, the number of electrodes of the semiconductor component illustrated in FIGS. 5 and 6, and the number of electrodes of the semiconductor component illustrated in FIGS. 3 and 7 are different from each other. However, the semiconductor component is not limited to the examples illustrated in FIG. 3, 5, 6 or 7, but there are various types of modification examples.

As illustrated in FIG. 3, the wiring substrate 10 includes the upper surface (a surface, a main surface, or a component mounting surface) 10t over which the logic component LC and the memory component MC are mounted, a lower surface (a surface, a main surface, or amounting surface) 10b which is on the opposite side of the upper surface 10t, and a plurality of side surfaces 10s which are disposed between the upper surface 10*t* and the lower surface 10*b*, and has a quadrangle outer shape when seen in a plan view as illustrated in FIG. 2. In the example illustrated in FIG. 2, a planar size (a dimension when seen in a plan view, dimensions of the upper surface lot and the lower surface 10*b*, an outer size) of the wiring substrate 10 is set such that a length of one side is about 30 mm to 100 mm, for example, and has a quadrangle plane shape.

As illustrated in FIG. 2, the upper surface 10*t* (and the lower surface 10*b* illustrated in FIG. 3) of the wiring substrate 10 is provided with a substrate side 10*s*1 and a substrate side 10*s*2 opposite to the substrate side 10*s*1 when seen in a plan view. In addition, the upper surface 10*t* (and the lower surface 10*b* illustrated in FIG. 3) of the wiring substrate 10 includes a substrate side 10*s*3 intersecting with each of the substrate side 10*s*1 and the substrate side 10*s*2, and a substrate side 10*s*4 opposite to the substrate side 10*s*3 and further intersecting with each of the substrate side 10*s*1 and the substrate side 10*s*2.

In the example illustrated in FIG. 2, each of the substrate side 10*s*1 and the substrate side 10*s*2 extends along the Y direction. In addition, each of the substrate side 10*s*3 and the substrate side 10*s*4 extends along the X direction which is orthogonal to the Y direction.

The wiring substrate 10 is an interposer (relay substrate) which is configured to electrically connect the plurality of semiconductor components including the logic component LC mounted over the upper surface 10*t* side with a motherboard (mounting substrate) (not illustrated). In addition, the wiring substrate 10 forms a part of a transmission path that electrically connects the logic component LC mounted over the upper surface 10*t* side with the plurality of memory components MC.

In addition, as illustrated in FIG. 3, the wiring substrate 10 includes a plurality of wiring layers that electrically connect the upper surface 10*t* side which is the component mounting surface, with the lower surface 10*b* side which is the mounting surface. In the example illustrated in FIG. 3, six wiring layers including wiring layers WL1, WL2, WL3, WL4 and WL5, and a wiring layer WL6 are provided. Each of the wiring layers has a conductor pattern such as a wiring 12WL, which is the path to supply an electrical signal or power, and is covered by the insulating layer 13.

In addition, the wiring substrate 10 is formed by stacking the plurality of wiring layers on an upper surface and a lower surface of a core layer (a core material or a core insulating layer) 13*c*, which is made of a prepreg in which glass fibers are impregnated with resin, for example, using a build-up method. In addition, the wiring layer WL3 on the uppermost surface side of the core layer 13*c* and the wiring layer WL4 on the lowermost surface side are electrically connected to each other via a plurality of through-hole wirings 12TW which are embedded in a plurality of through-holes provided so as to penetrate from one of the upper surface and the lower surface of the core layer 13*c* to the other.

As illustrated in FIG. 3, a plurality of bonding pads (bonding leads or semiconductor component connecting terminals) 14 are formed on the upper surface 10*t* of the wiring substrate 10 to be electrically connected to the logic component LC or the memory component MC. In addition, a plurality of terminals (lands or external connection terminals) 15, which are external input and output terminals of the semiconductor device PKG1, are formed on the lower surface 10*b* of the wiring substrate 10. The plurality of bonding pads 14 and the plurality of terminals 15 are electrically connected to each other via the wiring 12WL, a via wiring 12VW, and the through-hole wiring 12TW which are formed in the wiring substrate 10.

In addition, a large part of the wiring layer WL1, which is disposed in the uppermost surface 10*t* side among the plurality of wiring layers, is covered by the insulating film 17*t*. In addition, a large part of the wiring layer WL6, which is disposed in the lowermost surface 10*b* side among the plurality of wiring layers, is covered by the insulating film 17*b*.

Incidentally, the wiring substrate 10 is illustrated as a wiring substrate in which the plurality of wiring layers are stacked on each of the upper surface side and the lower surface side of the core layer 13*c* as the core material in the example illustrated in FIG. 3. However, a so-called coreless substrate, which is formed by stacking the conductor patterns such as the insulating layer 13 and the wiring 12WL in the order, may be used as a modification example of FIG. 3, instead of providing the core layer 13*c* made of a rigid material such as a prepreg material. In the case of using the coreless substrate, the through-hole wiring 12TW is not formed, and the wiring layers are electrically connected to each other via the via wiring 12VW. In addition, a wiring substrate including, for example, seven wiring layers or more, or five wiring layers or less may be used as a modification example, although FIG. 3 illustrates the wiring substrate 10 including the six wiring layers as an example.

In addition, the plurality of terminals 15 illustrated in FIG. 3 are the conductor patterns formed on the lowermost layer (the wiring layer WL6 on the sixth layer in the example illustrated in FIG. 3) among the plurality of wiring layers included in the wiring substrate 10. To be specific, the conductor pattern formed on the lowermost layer is covered by the insulating film 17*b* formed to cover the lower surface 10*b* of the wiring substrate 10. In addition, a plurality of opening portions are formed in the insulating film 17*b*, and each part of the conductor patterns formed on the wiring layer WL6 as the lowermost layer is exposed in each of the plurality of opening portions. This part exposed from the insulating film 17*b* functions as the external terminal of the semiconductor device PKG1.

In addition, a solder ball (a solder material, an external terminal, an electrode, or an external electrode) SB1 is connected to each of the plurality of terminals 15 in the example illustrated in FIG. 3. The solder ball SB1 is a conductive member which electrically connects a plurality of terminals on the mounting substrate side with the plurality of terminals 15 when the semiconductor device PKG1 is mounted over the mounting substrate (not illustrated). The solder ball SB1 is a solder material which is made of, for example, a lead (Pb)-containing Sn—Pb solder material or a so-called lead-free solder that substantially does not contain Pb. Examples of the lead-free solder include pure tin (Sn), tin-bismuth (Sn—Bi), tin-copper-silver (Sn—Cu—Ag), tin-copper (Sn—Cu), and the like. Here, the lead-free solder means a material with a content of lead (Pb) being equal to or lower than 0.1 wt %, and this content is defined based on an instruction by restriction of hazardous substances (RoHS).

In addition, the plurality of terminals 15 are (regularly) arrayed in a plurality of columns along the outer circumference of the lower surface 10*b* of the wiring substrate 10, as illustrated in FIG. 4. In addition, a plurality of the solder balls SB1 (see FIG. 3), which are bonded to the plurality of terminals 15, are also (regularly) arrayed in a plurality of columns along the outer circumference of the lower surface 10*b* of the wiring substrate 10. In other words, the plurality of terminals 15 disposed on the lower surface 10*b* side of the wiring substrate 10, and the plurality of solder balls SB1 connected to the plurality of terminals 15 are arrayed in a matrix form. In this manner, the semiconductor device in which the plurality of external terminals (the solder ball SB1 and the terminal 15) are arrayed in the plurality of columns on the mounting surface side of the wiring substrate 10 is referred to as an area array type semiconductor device. The area array type semiconductor device can effectively use the mounting surface (the lower surface 10b) side of the wiring substrate 10 as a disposition space of the external terminal, and thus, the area array type semiconductor device is preferable in that it is possible to suppress an increase of the mounting area of the semiconductor device even when the number of external terminals is increased. That is, it is possible to mount the semiconductor device with the increased number of external terminals in accordance with high functionality and high integration while saving the space.

In addition, the semiconductor device PKG1 includes the logic component LC and the plurality of memory components MC mounted over the wiring substrate 10, as illustrated in FIG. 2. The logic component LC and the plurality of memory components MC are mounted side by side on the wiring substrate 10. In other words, the logic component LC and the plurality of memory components MC are not stacked on each other, and do not include parts overlapping with each other when seen in a plan view.

Incidentally, the logic component LC is the semiconductor chip in the example of the present embodiment. In addition, the memory component MC is the semiconductor package in which a semiconductor chip (memory chip) 22 including the memory circuit RAM (see FIG. 1) is mounted over a wiring substrate (package substrate) 22WS, and is electrically connected to an electrode 22P provided in the wiring substrate 22WS, as illustrated in FIG. 7. However, the semiconductor component to be mounted over the wiring substrate 10 illustrated in FIG. 3 may be either the semiconductor chip or the semiconductor package. For example, the logic component LC may be the semiconductor package. In addition, each of the plurality of memory components MC may be the semiconductor chip.

In addition, when a description is given regarding a surface (except for a side surface) of the semiconductor component in the following description, the description is given assuming each surface of the semiconductor components over which the plurality of electrodes are disposed as a front surface (or an upper surface), and a surface on the opposite side of the surface as a rear surface. For example, a surface over which the plurality of electrodes 21P of the semiconductor chip (logic chip) are disposed is a front surface LCt in the logic component LC according to the present embodiment illustrated in FIG. 5. In addition, for example, a surface over which the electrodes 22P, which are the plurality of terminals provided in the wiring substrate 22WS, are disposed is a front surface MCt in the memory component MC illustrated in FIG. 6. Accordingly, the memory component MC has the built-in semiconductor chip (memory chip) between the front surface MCt and a rear surface MCb (see FIG. 3). Further, the electrodes of the semiconductor chip, built in the memory component MC, are electrically connected to the plurality of electrodes 22P disposed on the front surface MCt of the memory component MC.

In addition, the logic component LC has a quadrangle plane shape with a smaller plane area than the wiring substrate 10 when seen in a plan view. To be specific, the logic component LC has a component side 21s1, a component side 21s2 opposite to the component side 21s1, a component side 21s3 intersecting with each of the component side 21s1 and the component side 21s2, and a component side 21s4 opposite to the component side 21s3 when seen in a plan view.

In the example illustrated in FIG. 2, the logic component LC is mounted over the wiring substrate 10 in the state in which the component side 21s1 is opposite to the substrate side 10s1 (that is, the opposite state). To be specific, the logic component LC is mounted over the wiring substrate 10 in a state in which the component side 21s1 and the substrate side 10s1 are opposite to each other, the component side 21s2 and the substrate side 10s2 are opposite to each other, the component side 21s3 and the substrate side 10s3 are opposite to each other, and the component side 21s4 and the substrate side 10s4 are opposite to each other. Incidentally, the "opposite state" described above includes a case in which another semiconductor component is disposed between the respective sides.

In addition, each of the plurality of memory components MC has a quadrangle outer shape with a smaller plane area than the wiring substrate 10 when seen in a plan view. In the example illustrated in FIG. 2, each of the plurality of memory components MC has a rectangular shape. To be specific, the memory component MC has a component side 22s1, a component side 22s2 opposite to the component side 22s1, a component side 22s3 intersecting with each of the component side 22s1 and the component side 22s2, and a component side 22s4 opposite to the component side 22s3 when seen in a plan view, as illustrated in FIG. 2. In addition, each of the component side 22s1 and the component side 22s2 is a long side, and each of the component side 22s3 and the component side 22s4 is a short side in the examples illustrated in FIGS. 2 and 6.

In addition, each area of the plurality of memory components MC is larger than the area of the logic component LC in the example illustrated in FIG. 2. The storage capacity of the memory component MC increases in proportion to the area of a formation region of the memory circuit RAM (see FIG. 1). Thus, each area of the plurality of memory components MC is larger than the area of the logic component LC, so that it is possible to increase the storage capacity of the memory component MC.

In the example illustrated in FIG. 2, each of the plurality of memory components MC is mounted over the wiring substrate 10 in a state in which the component side 22s1 and the substrate side 10s1 are opposite to each other, the component side 22s2 and the substrate side 10s2 are opposite to each other, the component side 22s3 and the substrate side 10s3 are opposite to each other, and the component side 22s4 and the substrate side 10s4 are opposite to each other. Incidentally, the "opposite state" described above includes a case in which another semiconductor component is disposed between the respective sides.

In addition, the memory component M1 among the plurality of memory components MC is mounted between the component side 21s1 of the logic component LC and the substrate side 10s1 of the wiring substrate 10. In addition, the memory component M2, a memory component M3, and a memory component M4 among the plurality of memory components MC are disposed side by side between a virtual line obtained by extending the component side 22s3 of the memory component M1 and the substrate side 10s3 of the wiring substrate 10 such that the memory component M2, a memory component M3, and a memory component M4 are adjacent to each other. To be specific, the memory component M2 among the plurality of memory components MC is mounted between the component side 22s3 of the memory component M1 and the substrate side 10s3 of the wiring substrate 10. In addition, the memory component M3 among the plurality of memory components MC is mounted between the component side 22s2 of the memory component M2 and the substrate side 10s2 of the wiring substrate 10. In addition, the memory component M4 among the plurality of memory components MC is mounted between the component side 22s2 of the memory component M3 and the substrate side 10s2 of the wiring substrate 10.

As illustrated in FIG. 2, when the plurality of memory components MC are aggregated and disposed at a location opposite to the component side 21s1 and a location opposite to the component side 21s3 among the four sides of the logic component LC, it is possible to secure the disposition space of wiring widely to electrically connect the memory component MC with the logic component LC.

Incidentally, the respective component sides of the plurality of semiconductor components are disposed to be approximately parallel to the respective substrate sides of the wiring substrate 10 in the example illustrated in FIG. 2. However, there are various types of modification examples regarding the layout of the semiconductor components, and, for example, an extending direction of the component side of the semiconductor component may intersect with the substrate side of the wiring substrate 10.

In addition, the logic component LC has the front surface (the main surface or the upper surface) LCt and a rear surface (a main surface or a lower surface) LCb on the opposite side of the front surface LCt, as illustrated in FIG. 3.

The plurality of electrodes (chip terminals or bonding pads) 21P are formed on the front surface LCt side of the logic component LC. The plurality of electrodes 21P are exposed from an insulating film formed on the front surface LCt of the logic component LC in the front surface LCt of the logic component LC. In the present embodiment, the plurality of electrodes 21P are arrayed in a plurality of columns (in an array form) along an outer circumference of the front surface LCt in the front surface LCt of the logic component LC, as illustrated in FIG. 5. When the plurality of electrodes 21P, which are the electrodes of the logic component LC, are arrayed in the plurality of columns in the array form, it is possible to effectively use the front surface LCt of the logic component LC as the disposition space of the electrode, which is preferable in that it is possible to suppress the increase of the plane area even when the number of electrodes of the logic component LC is increased. However, a semiconductor component in which the plurality of electrodes 21P are formed in a peripheral edge portion (region close to the peripheral edge) of the front surface LCt can also be applied, as a modification example with respect to the present embodiment, although not illustrated.

In addition, a plurality of semiconductor elements (circuit elements) are formed on the main surface (to be specific, a semiconductor element formation region provided in an element formation region of the semiconductor substrate as a base material of the logic component LC) of the logic component LC, although not illustrated. The plurality of electrodes 21P are electrically connected, respectively, to these plurality of semiconductor elements via a wiring (not illustrated) formed on a wiring layer which is disposed inside the logic component LC (to be specific, between the front surface LCt and the semiconductor element formation region (not illustrated)).

The logic component LC (to be specific, the base material of the logic component LC) is made of, for example, silicon (Si). In addition, the insulating film, which covers the base material and the wiring of the logic component LC, is formed on the front surface LCt, and each part of the plurality of electrodes 21P is exposed from the insulating film in an opening portion formed in the insulating film. In addition, each of the plurality of electrodes 21P is made of metal, and, for example, is made of aluminum (Al) in the present embodiment. Incidentally, the material forming the electrode 21P is not limited to the aluminum (Al), but may be copper (Cu).

In addition, the logic component LC is mounted over the wiring substrate 10 in a state in which the front surface LCt as the electrode disposition surface is opposite to the upper surface 10t of the wiring substrate 10 in the example illustrated in FIG. 3. Such a mounting scheme is referred to as a face-down mounting scheme or a flip-chip connection scheme. Incidentally, the plurality of electrodes and and the terminals of the wiring substrate 10 are connected to each other via wires when the logic component LC is mounted over the wiring substrate 10 in a state in which the rear surface LCb on the opposite side of the front surface LCt, which is the electrode disposition surface, is opposite to the upper surface 10t of the wiring substrate 10, although not illustrated. Such a connection scheme is referred to as a wire connection scheme.

In the flip-chip connection scheme, the plurality of electrodes 21P and the plurality of bonding pads 14 of the wiring substrate 10 are electrically connected to each other via a plurality of protruding electrodes (bump electrodes) SB2, as illustrated in FIG. 3, which is different from the wire connection scheme described above. The protruding electrode SB2 is a metal member (conductive member) formed to protrude on the front surface LCt of the logic component LC. The protruding electrode SB2 is a so-called solder bump in which a solder material is stacked on the electrode 21P with an underlying metal film (under bump metal) interposed therebetween in the present embodiment. Examples of the underlying metal film can include a stacked film, for example, in which titanium (Ti), copper (Cu), and nickel (Ni) are stacked from a connection surface side with the electrode 21P (including a case in which a gold (Au) film is further formed on a nickel film).

In addition, it is possible to use a lead-containing solder material or a lead-free solder as a solder material to form the solder bump, as with the solder ball SB1 described above. When the logic component LC is mounted over the wiring substrate 10, the solder bumps are formed in advance on both of the plurality of electrodes 21P and the plurality of bonding pads 14, and the solder bumps are integrated by performing a heating process (reflow process) in a state in which the solder bumps are in contact with each other, thereby forming the protruding electrode SB2. In addition, a pillar bump (columnar electrode) in which a solder film is formed on a distal end surface of a conductive post made of copper (Cu) or nickel (Ni) may be used as the protruding electrode SB2, as a modification example with respect to the present embodiment.

In addition, each of the memory components MC has the front surface (the main surface or the upper surface) MCt, and the rear surface (the main surface or the lower surface) MCb on the opposite side of the front surface MCt, as illustrated in FIG. 3.

The plurality of electrodes (chip terminals or bonding pads) 22P are disposed in the front surface MCt of the memory component MC. The plurality of electrodes 22P are exposed from a protection film which protects the front surface MCt of the memory component MC in the front surface MCt of the memory component MC. In the present embodiment, the plurality of electrodes 22P are arrayed in a plurality of columns (in an array form) along the outer circumference of the front surface MCt in the front surface MCt of the memory component MC, as illustrated in FIG. 6.

In addition, the memory component MC is mounted over the wiring substrate 10 in a state in which the front surface MCt as the electrode disposition surface is opposite to the upper surface 10t of the wiring substrate 10 in the example illustrated in FIG. 3. That is, the plurality of electrodes 22P provided in the memory component MC are connected, respectively, to the bonding pads 14 of the wiring substrate 10 in the flip-chip connection scheme, which is similar to the case of the logic component LC.

Incidentally, the memory component MC according to the present embodiment is the semiconductor package in which the semiconductor chip 22 is mounted over the wiring substrate (package substrate) 22WS as illustrated in FIG. 7. To be specific, the semiconductor chip 22 includes a plurality of electrodes (pads) PD, and the plurality of electrodes PD are electrically connected, respectively, to the plurality of electrodes 22P, which are formed on the front surface MCt of the wiring substrate 22WS, via a plurality of wires (conductive members) members) BW and a plurality of wirings 22WL of the wiring substrate 22WS. In addition, the semiconductor chip 22 and the plurality of wires BW are sealed by a sealing body (resin or a sealing material) MR formed on one surface of the wiring substrate 22WS. The sealing body MR is formed on a surface opposite to the front surface MCt of the wiring substrate 22WS.

Incidentally, the memory component MC illustrated in FIG. 7 is an example, and there are various types of modification examples. For example, the semiconductor chip 22 and the wiring substrate 22WS are connected using the wire connection scheme in the example illustrated in FIG. 7, but may be connected using the flip-chip connection scheme, as with the logic component LC illustrated in FIG. 3. In addition, the single semiconductor chip 22 provided with the memory circuit RAM (see FIG. 1) is built in the memory component MC, for example, in the example illustrated in FIG. 7. However, a plurality of the semiconductor chips 22 may be stacked to form a memory component as a modification example. Further, the memory component MC may be the semiconductor chip as with the above-described logic component LC.

In addition, the protruding electrode SB2 is connected to each of the plurality of electrodes 22P, and the plurality of electrodes 22P of the memory component MC and the plurality of bonding pads 14 of the wiring substrate 10 are electrically connected to each other via the plurality of protruding electrodes SB2, as illustrated in FIG. 3. The protruding electrode SB2, and the underlying metal film which is disposed between the protruding electrode SB2 and the electrode 22P are the same as described above, and the redundant description thereof will be omitted.

In addition, the resin (an underfill resin or an insulating resin) UF is disposed each between the logic component LC and the wiring substrate 10, and between the memory component MC and the wiring substrate 10. The resin UF is disposed to block a clearance between the front surface LCt of the logic component LC and the upper surface 10t of the wiring substrate 10 and a clearance between the front surface MCt of the memory component MC and the upper surface 10t of the wiring substrate 10.

In addition, the resin UF is made of an insulating (non-conductive) material (for example, a resin material), and is disposed to seal electrical connection portions (bonding portions of the plurality of protruding electrodes SB2) between the semiconductor component (the logic component LC and the memory component MC) and the wiring substrate 10. When the bonding portions between the plurality of protruding electrodes SB2 and the plurality of bonding pads 14 are covered by the resin UF in this manner, it is possible to mitigate stress which is generated in the electrical connection portion between the semiconductor component and the wiring substrate 10. In addition, it is also possible to mitigate stress which is generated in bonding portions between the plurality of electrodes 21P of the logic component LC and the plurality of protruding electrodes SB2. Furthermore, it is possible to protect the main surface of the logic component LC on which the semiconductor element (circuit element) is formed. Details of the resin UF will be described later.

<Details of Component Mounting Layout>

Next, a description will be given regarding details of each layout of the plurality of semiconductor components in the upper surface 10t of the wiring substrate 10 illustrated in FIG. 2. As illustrated in FIG. 2, the logic component LC has a large distance (spacing distance) with respect to another semiconductor component (the memory component MC) and a large distance (spacing distance) with respect to a peripheral edge of the upper surface 10t of the wiring substrate 10, among the plurality of semiconductor components to be mounted over the upper surface 10t of the wiring substrate 10 according to the present embodiment.

For example, example, each of a distance (spacing distance) SPL1 between the logic component LC and the memory component M1, and a distance SPL3 between the logic component LC and the memory component M3 is larger than a distance SPMM1 between the memory component M1 and the memory component M2, which are disposed so to be adjacent to each other, in the example illustrated in FIG. 2.

In addition, each of a distance (spacing distance) SPLs2 between the logic component LC and the substrate side 10s2 of the wiring substrate 10, and a distance SPLs4 between the logic component LC and the substrate side 10s4 of the wiring substrate 10 is larger than the distance SPMM1 between the memory component M1 and the memory component M2.

In other words, the logic component LC is mounted near the center of the upper surface 10t of the wiring substrate 10, and the other plurality of memory components MC are mounted in a peripheral edge portion (region in the vicinity of the peripheral edge) of the upper surface 10t such that the distance with respect to the logic component LC is large.

As described above, the signal transmission path SGP2 (see FIG. 1), which is connected to the external equipment, is also connected to the logic component LC, in addition to the signal transmission path SGP1 (see FIG. 1) which is connected to the memory component MC. Thus, a larger number of wirings are densely formed in the perimeter of the logic component LC as compared to the perimeter of the memory component MC. In addition, the power consumption is greater in the logic component LC than in the memory component MC. Thus, it is preferable to increase an cross-sectional area of the path that supplies power to the logic component LC in order to avoid an instant voltage drop caused by the increase in power consumption. Thus, a wiring for power supply with a thick width is disposed in the perimeter of the logic component LC in some cases.

In this manner, it is preferable to increase the distance between the logic component LC and the other component in a case in which the wiring density is high in the perimeter of the logic component LC. In addition, it is preferable to increase the distance between the logic component LC and the peripheral edge of the upper surface 10t of the wiring substrate 10 from a point of view of securing a leading space of the wiring.

Meanwhile, it is preferable when the memory component MC can be mounted near the center of the upper surface 10t, but the priority of mounting the memory component MC near the center is low as compared to the logic component LC. In addition, when the area of the upper surface 10t is increased, a package size of the semiconductor device increases. Thus, each of the plurality of memory components MC is mounted in the peripheral edge portion of the upper surface 10t of the wiring substrate 10.

Meanwhile, when the memory component MC is mounted near the peripheral edge of the upper surface 10t, the resin UF illustrated in FIG. 2 spreads to the peripheral edge of the upper surface 10t, or beyond the peripheral edge of the upper surface 10t in some cases. Accordingly, the inventors of this application have studied a technique of providing the dam portion DM, which suppresses the spread of the resin UF, between the memory component MC and the peripheral edge, and suppressing that the resin UF spreads to the peripheral edge of the upper surface 10t.

<Details of Dam Portion>

Figure 8:
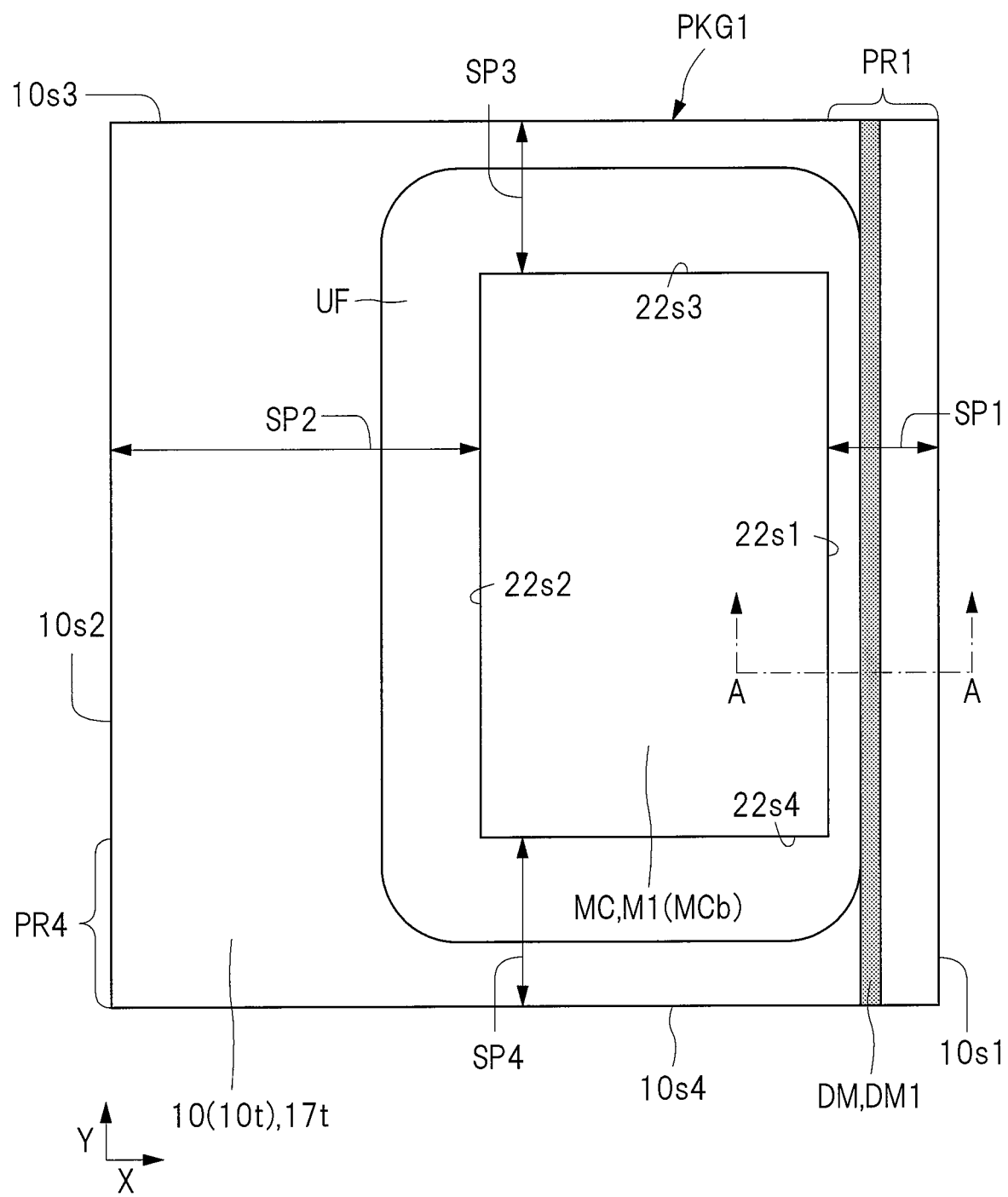
FIG. 8 is a plan view emphasizing and illustrating a perimeter of the memory component which is disposed between the logic component and aside of the wiring substrate in the component mounting surface of the wiring substrate illustrated in FIG. 2.
Figure 9:
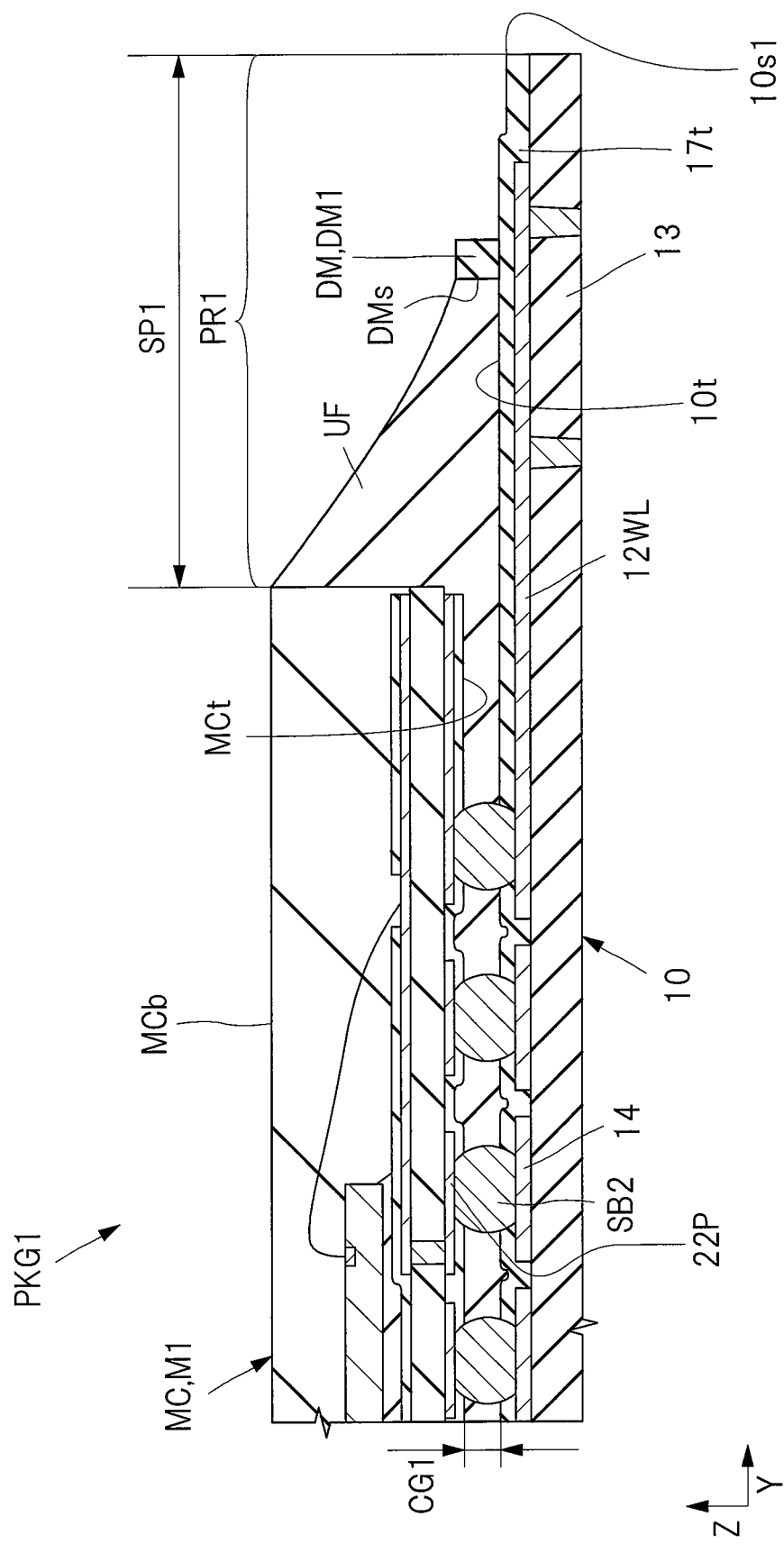
FIG. 9 is an enlarged cross-sectional view taken along a line A-A of FIG. 8.

FIG. 8 is a plan view emphasizing and illustrating a perimeter of the memory component which is disposed between the logic component and a side of the wiring substrate in the component mounting surface of the wiring substrate illustrated in FIG. 2. FIG. 9 is an enlarged cross-sectional view taken along a line A-A of FIG. 8.

Incidentally, FIGS. 8 and 9 illustrate the distance between the substrate side 10s1 and the substrate side 10s2 to be smaller than that that of FIG. 2 in order to illustrate a characteristic part of the configuration of the dam portion DM illustrated in FIG. 2 in an easily understandable manner. In addition, FIG. 8 also illustrates the distance between the substrate side 10s3 and the substrate side 10s4 to be smaller than that of FIG. 2 in addition to the above. In addition, FIG. 8 does not illustrate the logic component LC, the memory components M2 and M3, and the memory component M4, which are illustrated in FIG. 2, for the same reason.

In addition, FIG. 8 illustrates the dam portion DM formed in the vicinity of the memory component M1 particularly as a dam portion DM1, in order to distinguish the damportion DM formed in the vicinity of the memory component M1 illustrated in FIG. 2 from the dam portions DM formed in the vicinity of the other memory components M2, M3 and M4. However, each structure of the dam portions DM is the same in the present embodiment, and thus, a description will be given using the dam portion DM1 only when it is necessary to distinguish the dam portion DM1 from the other dam portions DM, and a description will be given using the dam portion DM when it is not particularly necessary to make a distinction.

As illustrated in FIG. 8, the semiconductor device PKG1 according to the present embodiment is provided with the wiring substrate 10 including the upper surface 10t, the insulating film 17t formed on the upper surface 10t, and the dam portion DM formed on the insulating film 17t. In addition, the semiconductor device PKG1 is provided with the memory component (semiconductor component) M1 mounted over the upper surface 10t of the wiring substrate 10. In addition, the semiconductor device PKG1 is provided with the resin UF located between the insulating film 17t and the memory component M1. The upper surface 10t has the substrate side 10s1 and the substrate side 10s2 opposite to the substrate side 10s1. In addition, a distance SP1 between the memory component M1 and the substrate side 10s1 is smaller than a distance SP2 between the memory memory component M1 and the substrate side 10s2. Further, the dam portion DM is formed between the memory component M1 and the substrate side 10s1, but is not formed between the memory component M1 and the substrate side 10s2.

That is, the dam portion DM illustrated in FIG. 8 is disposed in a region in which the distance SP1 between the semiconductor component and the peripheral edge is small, but is not disposed in a region in which the distance SP2 between the semiconductor component and the peripheral edge is large.

When the resin UF (see FIG. 9) in a liquid state, or a paste state is supplied between the memory component M1 (see FIG. 9) and the wiring substrate 10 (see FIG. 9) in a manufacturing step of the semiconductor device PKG1 to be described later, the resin UF overflowing from the clearance between the memory component M1 and the wiring substrate 10 spreads to the perimeter of the memory component M1. At this time, there is a case in which the spreading resin UF reaches the peripheral edge of the upper surface 10t and adheres to the side surface of the wiring substrate 10 in the region in which the distance SP1 between the semiconductor component and the peripheral edge is small, as described above.

The dam portion DM illustrated in FIGS. 8 and 9 is a member which suppresses the spread of the resin UF and has a damming function. In the example illustrated in FIG. 9, the dam portion DM is a wall (convex portion) formed to protrude above the insulating film 17t. In the present embodiment, the dam portion DM is formed between the memory component M1 and the substrate side 10s1 of the wiring substrate 10 with the small distance SP1, as illustrated in FIG. 9, the resin UF is dammed up by the dam portion DM. As a result, it is possible to suppress that the resin UF spreads to the substrate side 10s1 of the upper surface 10t, and adheres to the side surface of the wiring substrate 10.

In addition, the distance SP2 between the memory component M1 and the substrate side 10s2 is larger than the distance SP1, as illustrated in FIG. 8. Thus, the dam portion DM is not disposed between the memory component M1 and the substrate side 10s2. It is also possible to have a configuration in which the dam portion DM is disposed to continuously surround the perimeter of the memory component M1 when seen in a plan view from a point of view of suppressing the spread of the resin UF.

However, a margin of the supply amount of the resin UF decreases in a case in which the dam portion DM is disposed to continuously surround the perimeter of the memory component M1 when seen in a plan view. To be specific, the supply amount of the resin UF increases in the manufacturing step of the semiconductor device PKG1, there is a possibility that the resin UF climbs over a part of the dam portion DM.

Meanwhile, the dam portion DM is selectively formed in the region in which the distance SP1 between the memory component M1 and the peripheral edge of the upper surface 10t is small according to the present embodiment. Accordingly, the resin UF spreads to the region in which the dam portion DM is not disposed even if the supply amount of the resin UF increases, and thus, it is possible to suppress that the resin UF climbs over the dam portion DM. Thus, it is possible to reduce the possibility that the resin UF climbs over the dam portion DM as compared to the case of disposing the dam portion DM to continuously surround the perimeter of the memory component M1 according to the present embodiment, so that it is possible to suppress that the resin UF spreads to the substrate side 10s1 of the upper surface 10t.

In addition, the resin UF does not climb over the dam portion DM and spreads to the region in which the dam portion DM is not disposed even if the supply amount of the resin UF increases, as described above, according to the present embodiment. Accordingly, the margin which is allowable (hereinafter, it will be described as an allowable margin) increases in relation to the supply amount of the resin UF in the manufacturing step of the semiconductor device PKG1 according to the present embodiment.

The allowable margin of the supply amount of the resin UF increases in proportion to the amount of the resin UF which is required for the design. That is, when the volume of the space of the clearance between the memory component M1 and the wiring substrate 10 increases, the amount of the resin UF, which is required for the design, increases. Further, when the supply amount of the resin UF increases, a shake amount of the supply amount of the resin UF also increases.

For example, a clearance CG1 between the memory component M1 and the upper surface 10t illustrated in FIG. 9 is larger than a clearance CG2 between the logic component LC and the upper surface 10t illustrated in FIG. 3. In addition, the plane area of the memory component M1 (the area of the front surface MCt illustrated in FIG. 6) is larger than the plane area of the logic component LC (the area of the front surface LCt illustrated in FIG. 5), as illustrated in FIG. 2. Accordingly, the volume of the space of the clearance between the memory component M1 and the wiring substrate 10 illustrated in FIG. 3 is larger than the volume of the space of the clearance between the logic component LC and the wiring substrate 10. Accordingly, the supply amount of the resin UF, which is supplied between the memory component M1 and the wiring substrate 10, is likely to vary as compared to that of the resin UF which is supplied between the logic component LC and the wiring substrate 10. Thus, when the supply amount of the resin UF increases, the resin UF is likely to spread to the perimeter.

However, the dam portion DM is not disposed between the memory component M1 and the substrate side 10s2 according to the present embodiment as described above. Thus, the allowable margin increases in relation to the supply amount of the resin UF in the manufacturing step of the semiconductor device PKG1. As a result, it is possible to suppress that the resin UF spreads to the substrate side 10s1 of the upper surface 10t in the perimeter of the memory component M1 where the resin UF relatively easily spreads.

In addition, the dam portion DM is the wall (convex portion) formed to protrude on the insulating film 17t in the example illustrated in FIG. 9 as described above. The dam portion, which is the wall protruding toward an upper side of the insulating film 17t (a direction away from the upper surface 10t), can be formed using, for example, resin.

In addition, it is preferable that a height of the dam portion DM be high from a point of view of enhancing the effect of damming up the flow of the resin UF. In the example illustrated in FIG. 9, the height of the dam portion DM is greater than a thickness of the insulating film 17t. However, when the height of the dam portion DM is too high, there is a risk that the mounting of the memory component M1 becomes difficult. Accordingly, it is preferable that the spacing distance between the rear surface MCb of the memory component MC and the upper surface 10t of the wiring substrate 10 be greater than the height of the dam portion DM.

Incidentally, the above-described height of the dam portion DM is defined as a distance from an adhesion surface between the dam portion DM and the insulating film 17t to a location of the dam portion DM which is the farthest away from the insulating film 17t. In addition, the above-described thickness of the insulating film 17t is defined as a distance from the adhesion surface between the insulating film 17t and the dam portion DM to an underlying layer of the insulating film 17t (for example, an upper surface of the insulating layer 13 which is a base of the insulating film 17t in the example illustrated in FIG. 9).

In addition, the dam portion DM extends along the component side 22s1 among the four sides of the memory component M1 in the example illustrated illustrated in FIG. 8. In addition, when seen in a plan view, the resin UF spreads to continuously surround the perimeter of the memory component M1 (to be specific, the rear surface MCb of the memory component M1). In this case, it is also possible that the resin UF flows around the dam portion DM and reaches the substrate side 10s1 when a length of the dam portion DM is short. Accordingly, it is preferable that the length of the dam portion DM be longer than the component side 21s1 of the memory component M1. In addition, it is preferable to provide the dam portion DM between the component side 21s1 and the substrate side 10s1 in the entire component side 21s1.

In addition, there are modification examples regarding the dam portion DM provided with the function of suppressing the spread of the resin UF. Although the details will be described later, another insulating film may be further stacked on the insulating film 17t, and a groove formed in the insulating film may be used as the dam portion DM.

In addition, the distance SP1 between the memory component M1 and the substrate side 10s1 is small, as described above. Thus, the terminal, for example, the bonding pad 14 or the like is not formed between the memory component M1 and the substrate side 10s1. In addition, the entire region (peripheral region PR1) of the upper surface 10t located between the memory component M1 and the substrate side 10s1 is covered by the insulating film 17t, as illustrated in FIGS. 8 and 9.

In addition, the memory component M1 is disposed on the substrate side 10s1 of the wiring substrate 10, but is not mounted in a corner portion of the upper surface 10t in the example illustrated in FIG. 8. In other words, the distance SP1 between the memory component M1 and the substrate side 10s1 is smaller than each of a distance SP3 between the memory component M1 and the substrate side 10s3 and a distance SP4 between the memory component M1 and the substrate side 10s4 as well as the distance SP2 between the memory component M1 and the substrate side 10s2, as illustrated in FIG. 8.

As described above, it is preferable that the dam portion DM be selectively formed in the region in which the distance SP1 between the memory component M1 and the peripheral edge of the upper surface 10t is small, and the dam portion DM not be formed in the other region in order to prevent the resin UF from climbing over the dam portion DM.

Accordingly, the dam portion DM is not disposed between the memory component M1 and the substrate side 10s4 in the present embodiment. In addition, the terminal, for example, the bonding pad 14 or the like is not formed between the memory component M1 and the substrate side 10s1. Thus, the entire region (peripheral region PR4) of the upper surface 10t located between the memory component M1 and the substrate side 10s4 is covered by the insulating film 17t as illustrated in FIG. 8.

However, the dam portion DM is disposed between the memory component M1 and the substrate side 10s3, as illustrated in FIG. 2. This is because the memory component M2 is mounted between the memory component M1 and the substrate side 10s3, and the distance between the memory component M2 and the substrate side 10s3 is small. The dam portion DM, which is disposed between the memory component M2 and the substrate side 10s3 illustrated in FIG. 2, is provided to suppress the spread of the resin UF to the perimeter of the memory component M2. Accordingly, the dam portion DM is not necessarily disposed between the memory component M1 and the substrate side 10s3 when another component (an electronic component such as a semiconductor component) is not disposed between the memory component M1 and the substrate side 10s3, as illustrated in FIG. 8, as a modification example with respect to the present embodiment.

Figure 10:
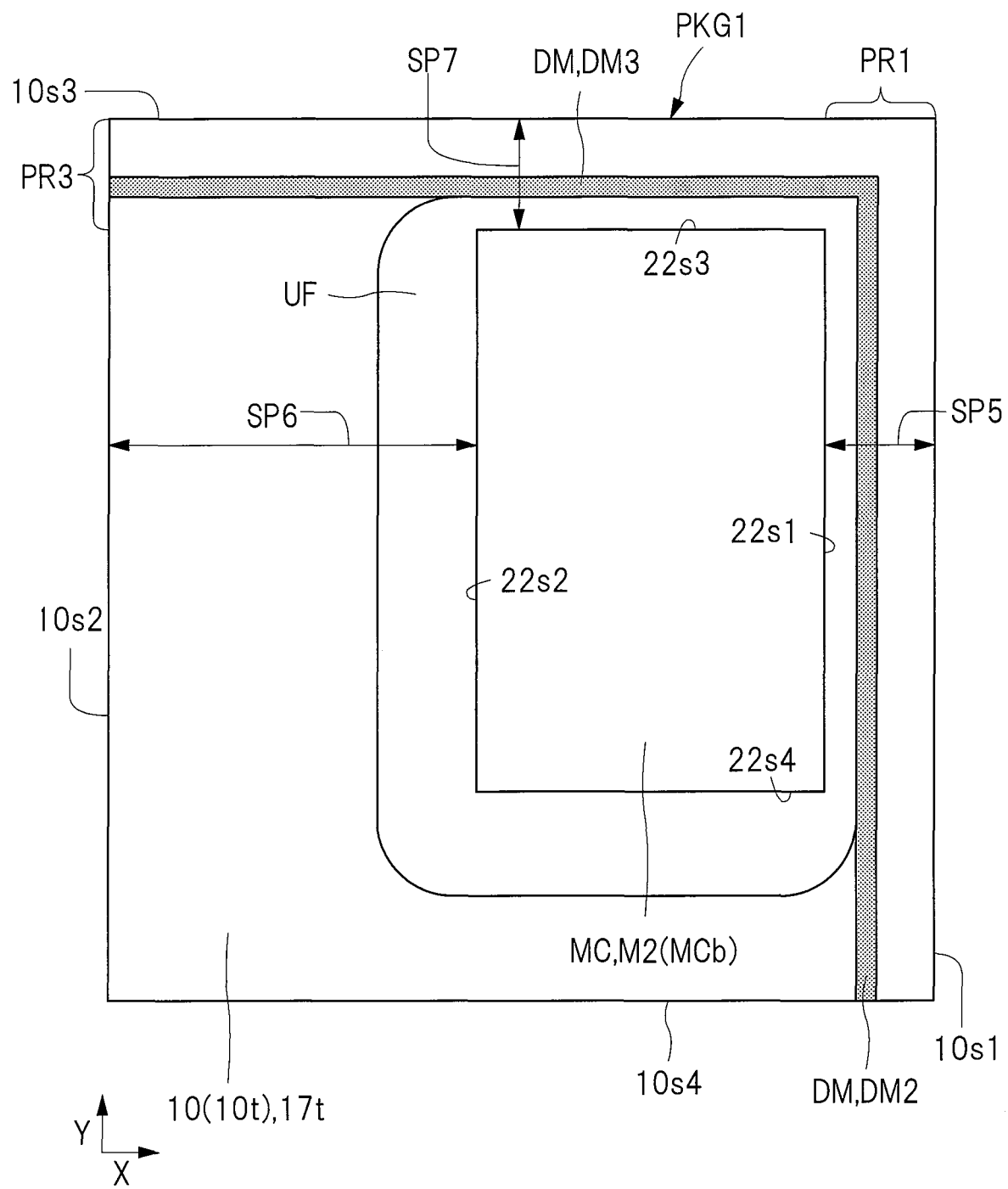
FIG. 10 is a plan view emphasizing and illustrating a perimeter of the memory component which is disposed in a corner portion of the wiring substrate in the component mounting surface of the wiring substrate illustrated in FIG. 2.

Next, a description will be given regarding a preferable configuration of of the dam portion DM in a case in which the semiconductor component is disposed in the corner portion of the upper surface 10t with reference to a plan view which focuses on the memory component M2 illustrated in FIG. 2. FIG. 10 is a plan view emphasizing and illustrating a perimeter of the memory component which is disposed in a corner portion of the wiring substrate in the component mounting surface of the wiring substrate illustrated in FIG. 2.

Incidentally, FIG. 10 illustrates the distance between the substrate side 10s1 and the substrate side 10s2 and the distance between the substrate side 10s3 and the substrate side 10s4 to be smaller than those of FIG. 2 in order to illustrate a characteristic part of the dam portion DM provided in the perimeter of the memory component M2 illustrated in FIG. 2 in an easily understandable manner. In addition, FIG. 10 does not illustrate the logic component LC, the memory components M1 and M3, and the memory component M4, which are illustrated in FIG. 2, for the same reason.

As illustrated in FIG. 10, the semiconductor device PKG1 according to the present embodiment is provided with the memory component (semiconductor component) M2 mounted over the upper surface 10t of the wiring substrate 10. In addition, the semiconductor device PKG1 is provided with the resin UF located between the insulating film 17t and the memory component M2. In addition, a distance SP5 between the memory component M2 and the substrate side 10s1 is smaller than a distance SP6 between the memory component M2 and the substrate side 10s2. In addition, a distance SP7 between the memory component M2 and the substrate side 10s3 is smaller than the distance SP6 between the memory component M2 and the substrate side 10s2.

Further, a dam portion DM2 is formed between the memory component M2 and the substrate side 10s1. In addition, a dam portion DM3 is formed between the memory component M2 and the substrate side 10s3. In addition, the dam portion DM is not formed between the memory component M2 and the substrate side 10s2.

As illustrated in FIG. 10, the memory component M2 is mounted in a region (corner portion) in the vicinity of a corner, which is an intersection point between the substrate side 10s1 and the substrate side 10s3 in the upper surface 10t of the wiring substrate 10. In this case, there is a possibility that the resin UF spreads to the peripheral edge of the upper surface 10t in any one direction or both directions of the X direction toward the substrate side 10s1 from the memory component M2 and the Y direction toward the substrate side 10s3 from the memory component M2.

Thus, each of the dam portion DM2 extending along the substrate side 10s1 and the dam portion DM3 extending along the substrate side 10s3 is disposed in the present embodiment. In the example illustrated in FIG. 10, the component side 22s1 of the memory component M2 extends along the substrate side 10s1. In addition, the component side 22s3 of the memory component M2 extends along the substrate side 10s3. Further, the dam portion DM2 extends along the component side 22s1. In addition, the dam portion DM3 extends along the component side 22s3.

In addition, the dam portion DM3 is linked to the dam portion DM2 as illustrated in FIG. 10. To be specific, the dam portion DM2 and the dam portion DM3, which are continuously linked to each other, are disposed respectively between each of the component side 22s1 and the component side 22s3 of the memory component M2 and each of the substrate side 10s1 and the substrate side 10s3 of the wiring substrate 10 when seen in a plan view. Thus, it is possible to suppress that the resin UF spreads to the peripheral edge of the upper surface 10t.

In addition, the dam portion DM is not formed between the memory component M2 and the substrate side 10s2. Further, the dam portion DM is not formed between the memory component M2 and the substrate side 10s4. Accordingly, it is possible to suppress that the resin UF climbs over the dam portion DM2 or the dam portion DM3.

In addition, the distance SP5 between the memory component M2 and the substrate side 10s1 is small, and the distance SP7 between the memory component M2 and the substrate side 10s3 is also small. Thus, the terminal, for example, the bonding pad 14 or the like is not formed between the memory component M2 and the substrate side 10s1, and between the memory component M2 and the substrate side 10s3. In addition, in the upper surface 10t, the entire region (peripheral region PR1) located between the memory component M2 and the substrate side 10s1, and the entire region (a peripheral region PR3) located between the memory component M2 and the substrate side 10s3, are covered by the insulating film 17t, as illustrated in FIG. 10.

Incidentally, each of the plurality of memory components MC is disposed to be close to the peripheral edge of the upper surface 10t of the wiring substrate 10 as much as possible in the present embodiment in order to widely secure a region in which another component is not mounted in the perimeter of the logic component LC illustrated in FIG. 2. Thus, the distance SP5 and the distance SP7 illustrated in FIG. 10 are equal (the same). In addition, the distance SP1 illustrated in FIG. 8 is equal to (the same as) the distance SP5 illustrated in FIG. 10).

Figure 11:
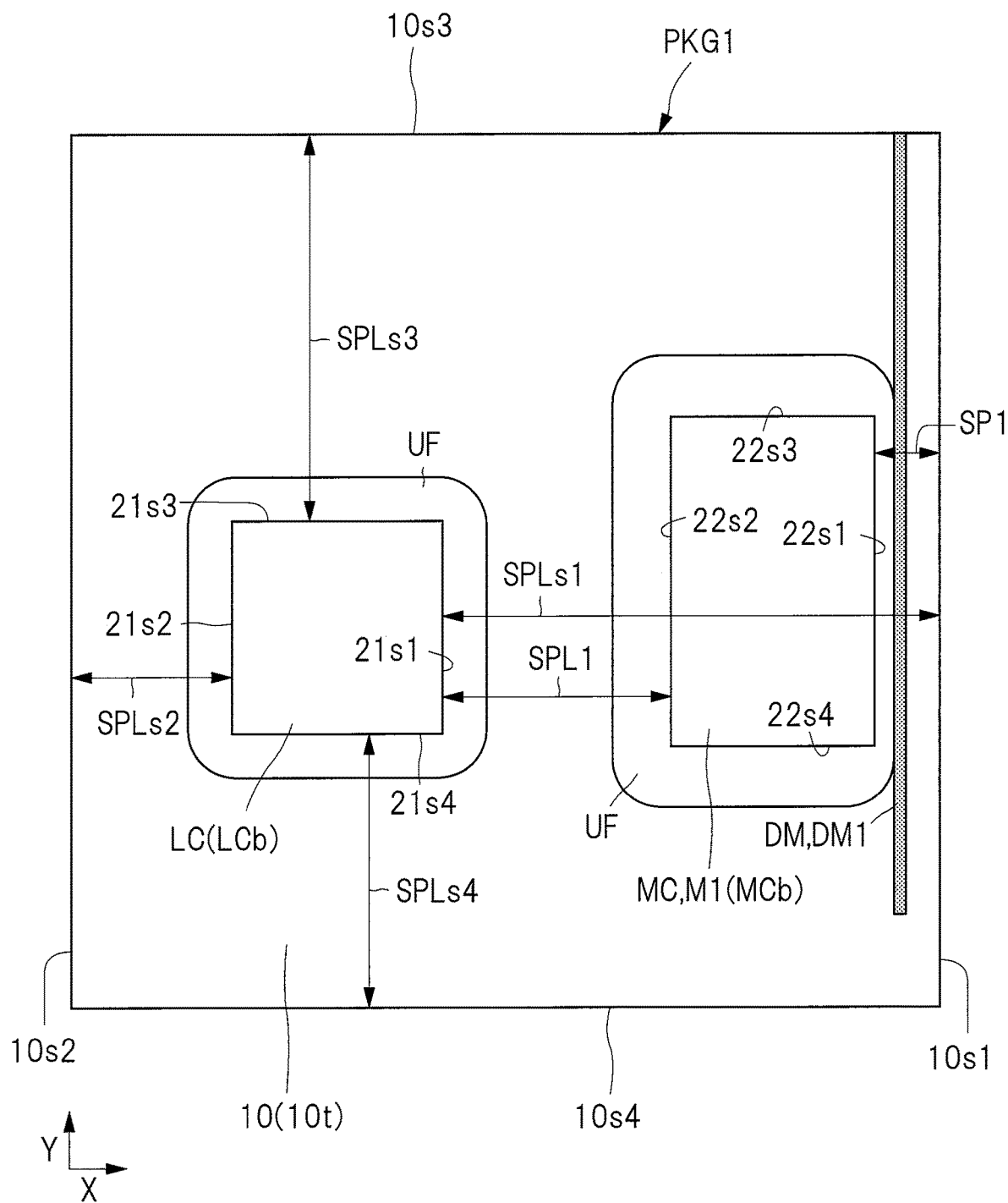
FIG. 11 is a plan view emphasizing and illustrating a perimeter of a memory component which is disposed between the logic component and a side of the wiring substrate, and a perimeter of the logic component.

Next, a description will be given regarding a preferable configuration of the dam portion DM in a case in which some of the plurality of semiconductor components are disposed in a central portion of the upper surface 10t (a location which is sufficiently far away from the peripheral edge) with reference to a plan view which focuses on a relationship between the logic component LC and the memory component M1 illustrated in FIG. 2. FIG. 11 is a plan view emphasizing and illustrating a perimeter of a memory component which is disposed between the logic component and a side of the wiring substrate, and and a perimeter of the logic component.

Incidentally, FIG. 11 illustrates the distance between the substrate side 10s1 and the substrate side 10s2 and the distance between the substrate side 10s3 and the substrate side 10s4 to be smaller than those of FIG. 2 in order to illustrate the relationship between the memory component M1 and the logic component LC illustrated in FIG. 2 in an easily understandable manner. In addition, FIG. 11 does not illustrate the memory components M2 and M3, and the memory component M4, which are illustrated in FIG. 2, for the same reason.

As illustrated in FIG. 11, the logic component LC is mounted between the substrate side 10s2 and the substrate side 10s1 on the upper surface 10t of the wiring substrate 10. In addition, the distance SP1 between the memory component M1 and the substrate side 10s1 is smaller than each of a distance SPLs1 between the logic component LC and the substrate side 10s1, and a distance SPLs2 between the logic component LC and the substrate side 10s2.

That is, the logic component LC is mounted at a location which is away from the substrate side 10s1 and the substrate side 10s2 when seen in a plan view. Thus, the dam portion DM is not provided in the vicinity of the logic component LC in the X direction.

In addition, the logic component LC is mounted between the memory component M1 and the substrate side 10s2. In addition, the distance SP1 between the memory component M1 and the substrate side 10s1 is smaller than the distance SPL1 between the memory component M1 and the logic component LC.

That is, the logic component LC is disposed such that a distance with respect to the other semiconductor component is wide. Thus, the dam portion DM is not provided between the logic component LC and the other semiconductor component. In particular, in a case in which the dam portion DM is not provided between the memory component M1 and the logic component LC, it is easy to suppress that the resin resin UF, which is supplied between the memory component M1 and the wiring substrate 10, climbs over the dam portion DM1. Accordingly, when the dam portion DM is not provided between the memory component M1 and the logic component LC, it is possible to suppress that the resin UF, which is supplied between the memory component M1 and the wiring substrate 10, reaches the substrate side 10s1.

In addition, similarly, the distance SP1 between the memory component M1 and the substrate side 10s1 is smaller than each of a distance SPLs4 between the logic component LC and the substrate side 10s4, and a distance SPLs3 between the logic component LC and the substrate side 10s3. Further, the distance SP1 between the memory component M1 and the substrate side 10s1 is smaller than the distance SPL3 between the memory component M3 and the logic component LC, as illustrated in FIG. 2.

Accordingly, the logic component LC is mounted at the peripheral edge of the wiring substrate 10 or a location which is far away from the other semiconductor component, and thus, the dam portion DM is not disposed in the perimeter of the logic component LC.

Figure 12:
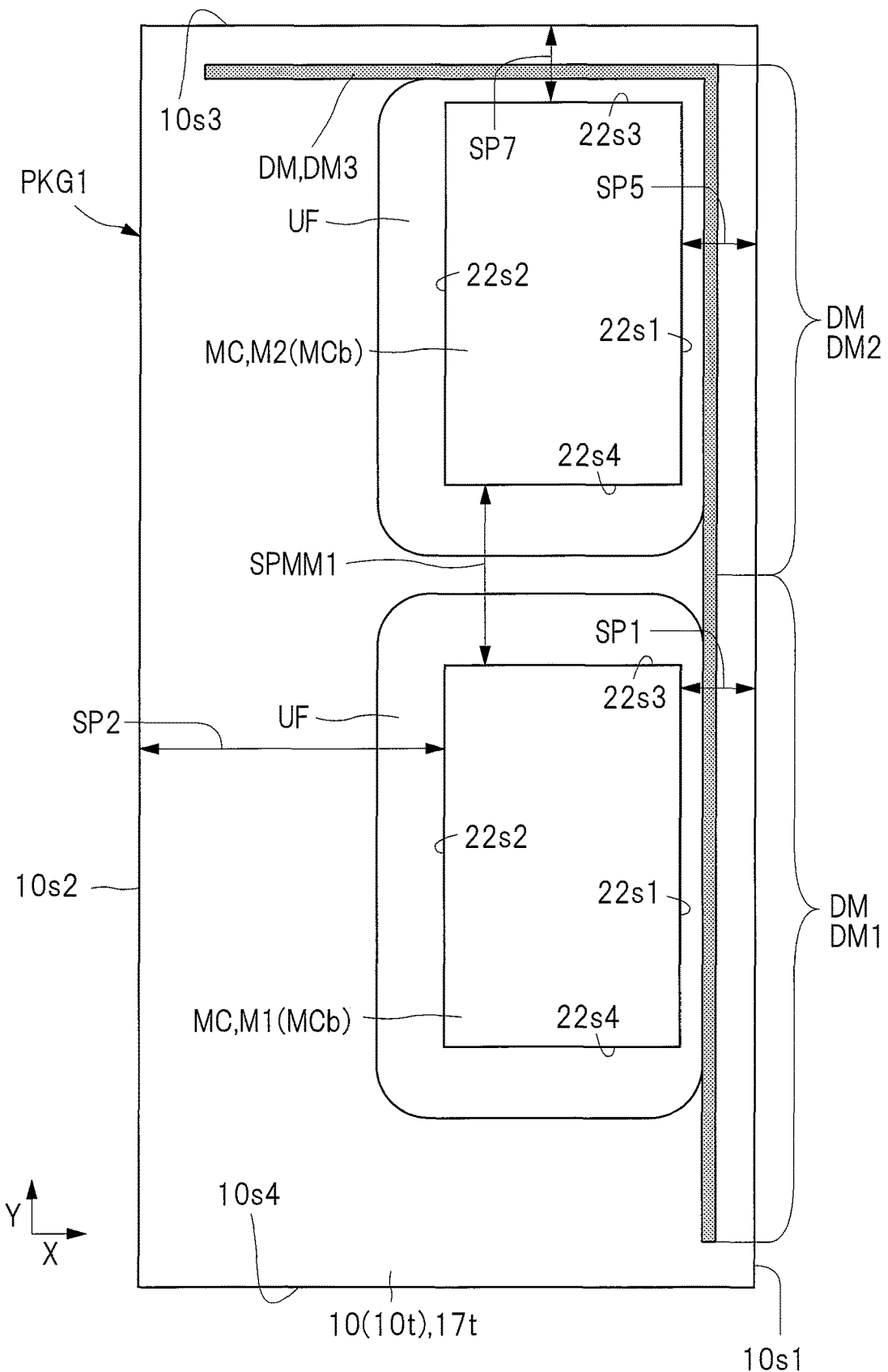
FIG. 12 is a plan view emphasizing and illustrating a perimeter of a memory component which is disposed between the logic component and a side of the wiring substrate, and a perimeter of a memory component which is disposed to be adjacent to the memory component.

Next, a description will be given regarding a preferable configuration of the dam portion DM in a case in which each of the plurality of semiconductor components is disposed to be close to the peripheral edge of the upper surface 10t with reference to a plan view which focuses on a relationship between the memory component M1 and the memory component M2 illustrated in FIG. 2. FIG. 12 is a plan view emphasizing and illustrating a perimeter of a memory component which is disposed between the logic component and a side of the wiring substrate, and a perimeter of a memory component which is disposed to be adjacent to the memory component.

Incidentally, FIG. 12 illustrates the distance between the substrate side 10s1 and the substrate side 10s2 and the distance between the substrate side 10s3 and the substrate side 10s4 to be smaller than those of FIG. 2 in order to illustrate a dam portion which is close to the memory component M1 and the memory component MC illustrated in FIG. 2 in an easily understandable manner. In addition, FIG. 12 does not illustrate the logic component LC, the memory component M3, and the memory component M4, which are illustrated in FIG. 2, for the same reason.

As illustrated in FIG. 12, the memory component M2 is mounted between the memory component M1 and the substrate side 10s3. In addition, each of the distance SP1 between the memory component M1 and the substrate side 10s1 and the distance SP7 between the memory component M2 and the substrate side 10s3 is smaller than the distance SP2 between the memory component M1 and the substrate side 10s2 when seen in a plan view. In addition, the wiring substrate 10 includes the dam portion DM1 formed on the insulating film 17t and formed between the memory component M1 and the substrate side 10s1 and the dam portion DM3 formed on the insulating film 17t and formed between the memory component M2 and the substrate side 10s3. Incidentally, the memory component M2 is close to both the substrate side 10s1 and the substrate side 10s3 in the example illustrated in FIG. 12. That is, the distance SP5 illustrated in FIG. 12 is small. Thus, the dam portion DM1 is linked to the dam portion DM3 via the dam portion DM2. However, the dam portion DM1 and the dam portion DM3 may be separated from each other in a case in which the distance SP5 is sufficiently wide.

In addition, each of the distance SP1 between the memory component M1 and the substrate side 10s1 and the distance SP7 between the memory component M2 and the substrate side 10s3 is smaller than the distance SPMM1 between the memory component M1 and the memory component M2 which are disposed so to be adjacent to each other when seen in a plan view. That is, there is a spacing distance between the resin UF which is supplied between the memory component M1 and the wiring substrate 10, and the resin UF which is supplied between the memory component M2 and the wiring substrate 10, at a degree that makes the contact therebetween hard. Thus, the dam portion DM is not disposed between the memory component M1 and the memory component M2.

In addition, each of the distance SP1 between the memory component M1 and the substrate side 10s1 and the distance SP5 between the memory component M2 and the substrate side 10s1 is smaller than the distance SP2 between the memory component M1 and the substrate side 10s2 when seen in a plan view, as illustrated in FIG. 12. In addition, the wiring substrate 10 includes the dam portion DM1 formed on the insulating film 17t and formed between the memory component M1 and the substrate side 10s1 and the dam portion DM2 formed on the insulating film 17t and formed between the memory component M2 and the substrate side 10s1.

Here, when the distance SPMM1 illustrated in FIG. 12 is sufficiently large, the dam portion DM1 and the dam portion DM2 may be separated from each other. However, it is preferable that the dam portion DM1 be linked to the dam portion DM2, as illustrated in FIG. 12, from a point of view of avoiding that the resin UF flows around a portion between the dam portion DM1 and the dam portion DM2 and reaches the substrate side 10s1.

<Method of Manufacturing Semiconductor Device>

Figure 13:
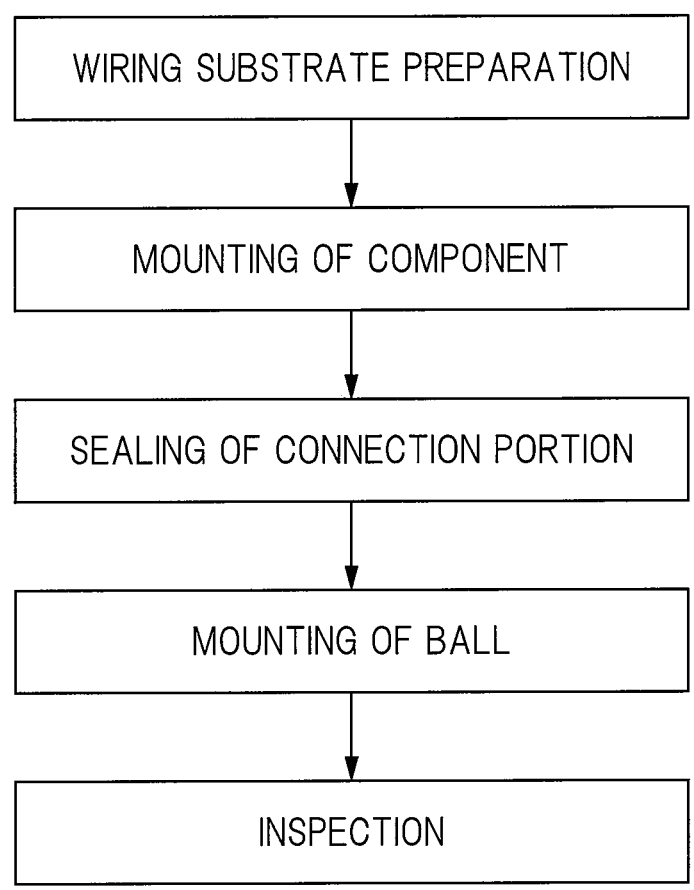
FIG. 13 is an explanatory diagram illustrating an overview of manufacturing steps of the semiconductor device which has been described with reference to FIGS. 1 to 12.

Next, a description will be given regarding the manufacturing steps of the semiconductor device PKG1 which has been described with reference to FIGS. 1 to 12. A description will be given with reference to a flowchart illustrating a flow of the manufacturing steps, and to FIGS. 1 to 12 (if necessary), in the following description. FIG. 13 is an explanatory diagram illustrating an overview of the manufacturing steps of the semiconductor device which has been described with reference to FIGS. 1 to 12. Incidentally, a description will be given regarding an embodiment in which a semiconductor component is mounted over the wiring substrate 10 illustrated in FIG. 2 in order for simplification of description in the present embodiment. However, there is also a method, as a modification example, of preparing a so-called multiple-piece substrate provided with a plurality of product formation regions, which corresponds to the wiring substrate 10, collectively assembling a plurality of semiconductor devices, and then, dividing the substrate for each of the product formation regions. In this case, it is possible to make the assembly step efficient.

<Wiring Substrate Preparation>

Figure 14:
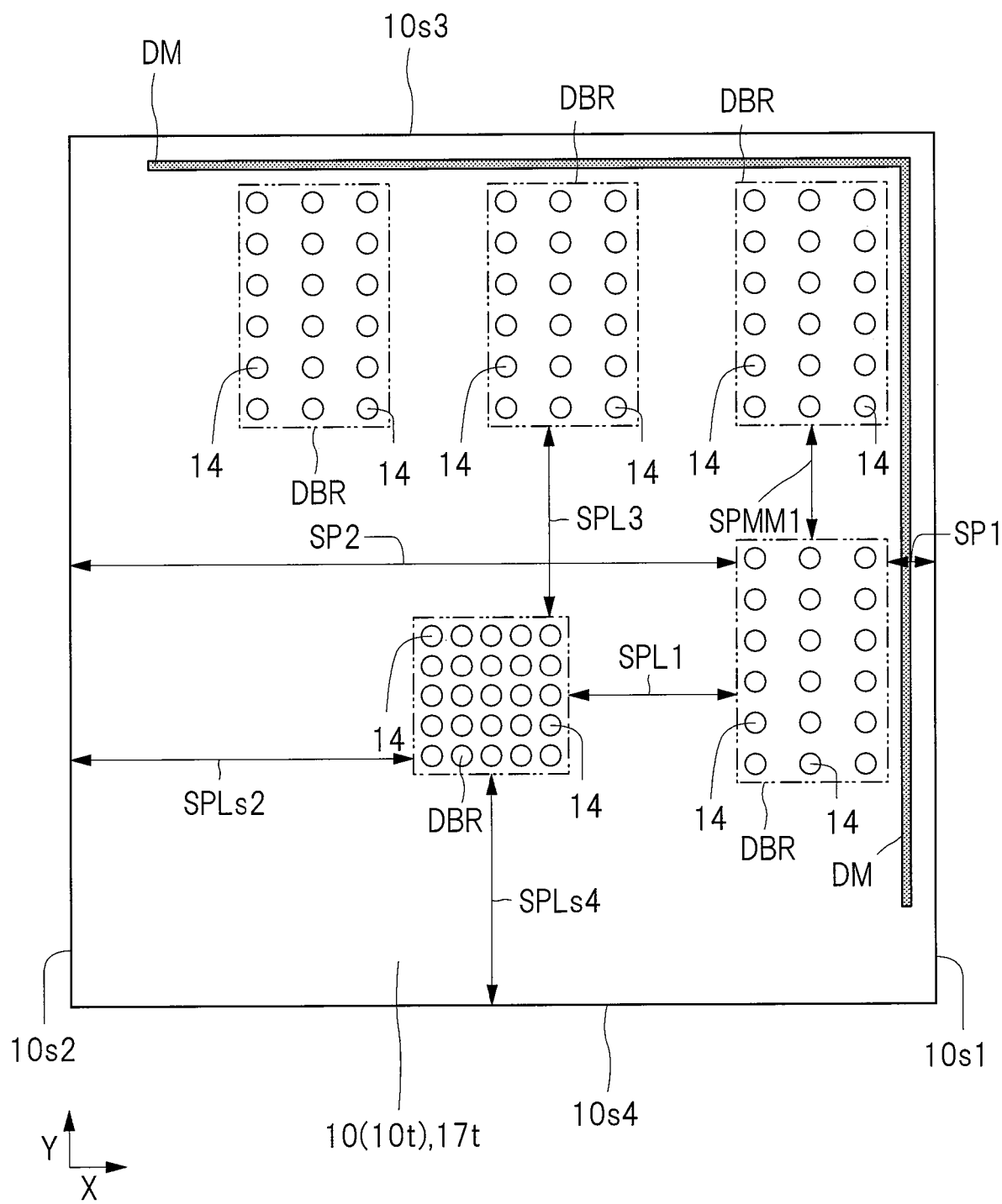
FIG. 14 is a plan view illustrating a component mounting surface side of the wiring substrate which is prepared in the wiring substrate preparation step illustrated in FIG. 13.

First, the wiring substrate 10 illustrated in FIG. 14 is prepared in a wiring substrate preparation step. FIG. 14 is a plan view illustrating a component mounting surface side of the wiring substrate which is prepared in the wiring substrate preparation step illustrated in FIG. 13. A plurality of component mounting regions DBR (regions in which the semiconductor components illustrated in FIG. 3 are planned to be mounted) are provided on the upper surface 10t side of the wiring substrate 10, which is prepared in this step, and the plurality of bonding pads 14, which are exposed from the insulating film 17t in the opening portions, are formed in each inner side of the plurality of component mounting regions DBR.

In addition, the plurality of terminals 15 are formed on the lower surface (the rear surface or the mounting surface) 10b (see FIG. 3) on the opposite side of the upper surface 10t of the wiring substrate 10, as illustrated in FIG. 3. The solder balls SB1 illustrated in FIG. 3 are not connected to the plurality of terminals 15, and each of the plurality of terminals 15 is exposed from the insulating film (a solder resist film) 17b in the opening portion, in the wiring substrate 10 which is prepared in this step.

In addition, the upper surface 10t of the wiring substrate 10, which is prepared in this step, is covered by the insulating film (solder resist film) 17t, and the dam portion DM is formed on the insulating film 17t. The details of the dam portion DM is the same as already described above, and thus, the redundant description thereof will be omitted.

<Mounting of Component>

Next, the logic component LC and each of the plurality of memory components MC are mounted in the component mounting region DBR (see FIG. 14) of the wiring substrate 10, as illustrated in FIG. 2, in a component mounting step.

In the component mounting step, the plurality of semiconductor components are mounted over the upper surface 10t of the wiring substrate 10, as illustrated in FIG. 2. In this step, the plurality of semiconductor components are mounted over the wiring substrate 10 such that the front surface LCt of the logic component is opposite to the upper surface 10t of the wiring substrate 10 (to be specific, the upper surface of the insulating film. 17t), and the front surface MCt of each of the plurality of memory components MC is opposite to the upper surface 10t of the wiring substrate 10, as illustrated in FIG. 3.

In addition, the plurality of electrodes 21P of the logic component LC and the plurality of bonding pads 14 of the wiring substrate 10 are electrically connected to each other via the plurality of protruding electrodes (bump electrodes or conductive members) SB2, as illustrated in FIG. 3, in this step. In addition, the plurality of electrodes 22P which are provided, respectively, in the plurality of memory components MC, and the plurality of bonding pads 14 of the wiring substrate 10 are electrically connected to each other via the plurality of protruding electrodes SB2.

<Sealing of Connection Portion>

Figure 15:
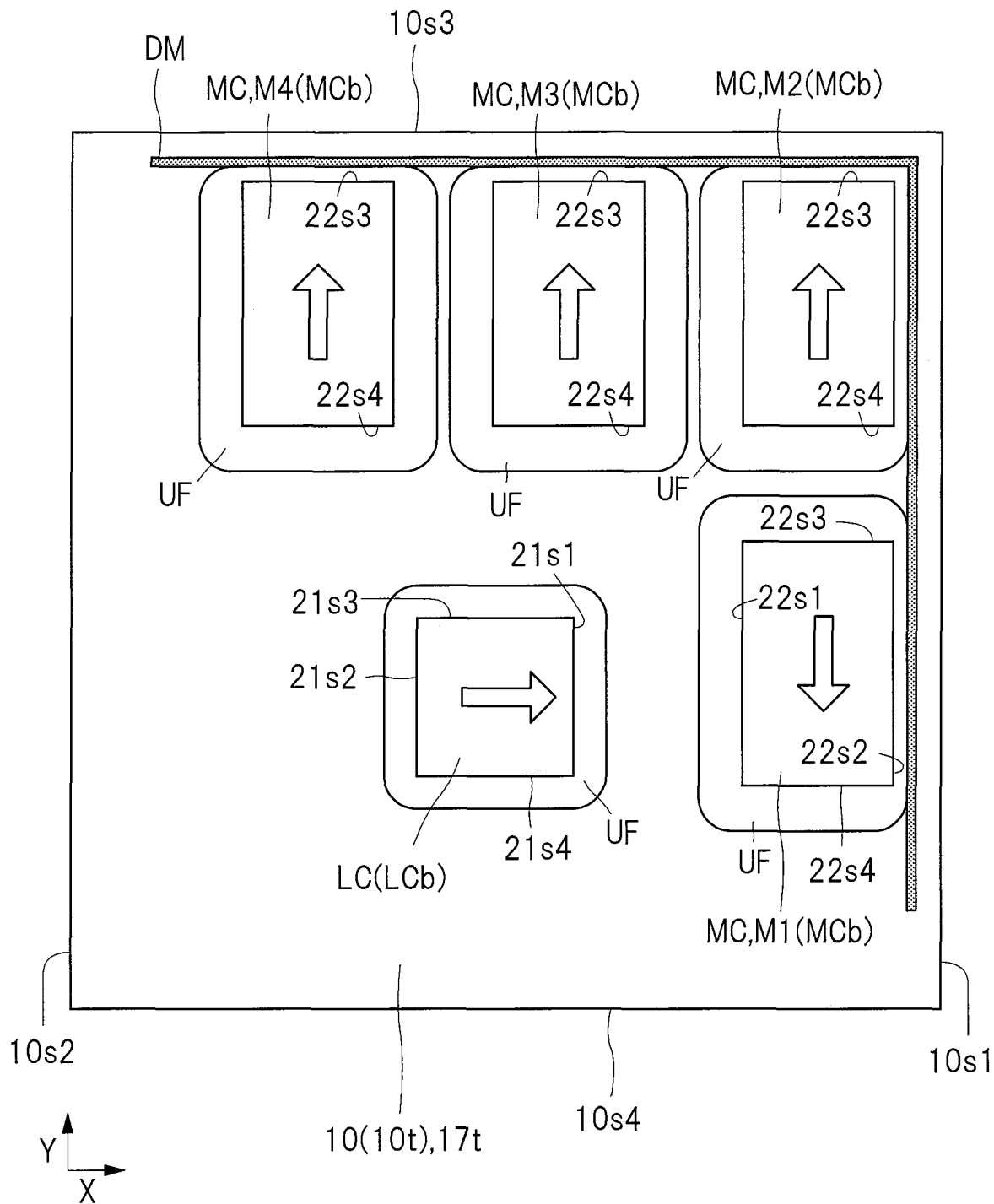
FIG. 15 is an enlarged cross-sectional view illustrating a state in which resin is disposed between the semiconductor component and the wiring substrate to seal a connection portion between an electrode of the semiconductor component and a terminal of the wiring substrate in the connection portion sealing step illustrated in FIG. 13.

Next, a perimeter of the connection portions in which the semiconductor components and the wiring substrate are electrically connected to each other via the plurality of protruding electrodes SB2 is sealed by the insulating material such as resin in a connection portion sealing step. FIG. 15 is an enlarged cross-sectional view illustrating a state in which the resin is disposed between the semiconductor component and the wiring substrate to seal a connection portion between an electrode of the semiconductor component and a terminal of the wiring substrate in the connection portion sealing step illustrated in FIG. 13. Incidentally, FIG. 15 illustrates an example of a supply direction of the resin using an arrow having a wide width.

In this step, a supply port of the resin UF is disposed on any one of the four sides of the semiconductor component, and the filling of the resin is performed toward a side on the opposite side of the side (any one of the four sides described above). When the plane shape is a rectangular shape, the supply port of the resin UF is disposed on any one of the short sides, for example, and the filling of the resin is performed toward the other short side.

In addition, it is preferable to supply the resin UF from a side on the opposite side of the dam portion DM toward a side close to the dam portion in this step, in order to prevent the resin UF from climbing over the dam portion DM as described above.

In the example illustrated in FIG. 15, the resin UF is supplied from the component side 22s4 located to be the farthest away from the substrate side 10s3 toward the component side 22s3 opposite to the component side 22s4, with respect to each of the memory components M2 and M3, and the memory component M4. In addition, the resin UF is supplied from the component side 22s3 toward the component side 22s4 with respect to the memory component M1. However, the resin may be supplied from the component side 22s1 toward the component side 22s2 as a modification example. In this case, the resin UF is supplied from a long side, and thus, a moving distance of the supply port increases, but the spread of the resin UF is easily dammed up by the dam portion DM as the resin UF is supplied toward the dam portion DM.

Incidentally, the logic component LC has the sufficiently large spacing distance with respect to the other semiconductor components, as described above. Thus, the supply direction of the resin UF is not particularly limited with respect to the logic component LC.

In addition, the resin UF is supplied between the semiconductor component and the wiring substrate 10 after each of the plurality of semiconductor components is mounted over the wiring substrate 10 in the example illustrated in FIG. 13 (such a method is referred to as a post-injection method). In addition, the clearance CG1 between the memory component M1 and the upper surface 10t illustrated in FIG. 9 is larger than the clearance CG2 between the logic component LC and the upper surface 10t illustrated in FIG. 3, but each of the clearance CG1 and the clearance CG2 is smaller than 1 mm, for example. Thus, a material with low viscosity before curing is used as the resin UF in many cases, and the filling of the resin UF is performed using surface tension of a liquid.

Accordingly, it is preferable that the dam portion DM illustrated in FIG. 9 has a sharp upper end of a side surface DMs on the semiconductor component side, which dams up the resin UF. When the upper end of the side surface DMs is sharp, the resin UF is easily dammed up by the sharp portion of the dam portion DM due to a surface tension effect of the resin in a liquid state.

For example, when a shape of the insulating film 17t illustrated in FIG. 9 is recessed in accordance with the conductor pattern of the underlying layer, as in a portion between the neighboring bonding pads 14, the upper end of the damming surface is not sharp but round. In this case, the surface tension hardly occurs. Meanwhile, the dam portion DM is a member formed separately from the insulating film 17t according to the present embodiment. For example, the dam portion DM is formed by stacking a resin film on the insulating film 17t and performing an etching process such that a part of the resin film remains. In this case, the upper end of the side surface DMs of the dam portion DM is easily sharpened, and it is easy to suppress the proceeding of the resin UF before curing, which is preferable.

In addition, when the resin UF is disposed using the post-injection scheme as in the present embodiment, the filling of the resin UF is performed, and then, the resin UF is cured by heating, for example. In this manner, the plurality of protruding electrodes SB2 are sealed. When the resin UF is disposed to cover each perimeter of the plurality of protruding electrodes SB2, and then cured, it is possible to protect the connection portions formed by the protruding electrodes SB2.

<Mounting of Ball>

Next, the plurality of solder balls SB1 serving as the external terminals are bonded to the plurality of terminals 15 formed on the lower surface 10b of the wiring substrate 10, as illustrated in FIG. 3, in a ball mounting step.

In this step, the lower surface 10b of the wiring substrate 10 is set to face the upper side, and then, the solder ball SB1 is disposed on each of the plurality of terminals 15 exposed in the lower surface 10b of the wiring substrate 10. Thereafter, the plurality of solder balls SB1 are heated to be bonded to the terminals 15. Through this step, the plurality of solder balls SB1 are electrically connected to the semiconductor components via the wiring substrate 10.

However, a technique to be described in the present embodiment is not limitedly applied to a so-called ball grid array (BGA) type semiconductor device in which the solder balls SB1 are bonded in an array form. For example, the technique can be applied to a so-called land grid array (LGA) type semiconductor device, as a modification example with respect to the present embodiment, which is shipped in a state of exposing the terminal 15 without forming the solder ball SB1 or shipped in a state in which a solder paste is applied on the terminal 15 to be thinner than the solder ball SB1. The ball mounting step can be omitted in the case of the LGA type semiconductor device.

<Inspection>

Next, a required inspection such as an appearance inspection of the semiconductor device PKG1 (see FIG. 1) is performed in an inspection step. Here, when the resin UF, used in the above-described connection portion sealing step, spreads over the peripheral edge of the wiring substrate 10, and some of the resin UF adhere to the side surface of the wiring substrate 10, for example, there is a case in which such a semiconductor device is determined as a defective product in an appearance inspection step.

There is a case in which such defective products include a semiconductor device in which a degree of adherence to a side surface of resin is small, and which can be commercialized after correction or the like. However, it is necessary to confirm an inspected body, which is determined to be defective by, for example, visual observation and to determine the degree of adherence even in this case, which causes the reduction in manufacturing efficiency.

Meanwhile, the spread of the resin UF is suppressed by the dam portion DM according to the present embodiment, as described above, frequency that a semiconductor device is determined as a defective product in this step is significantly reduced. As a result, it is possible to improve the manufacturing efficiency of the semiconductor device.

In the foregoing, the invention made by the inventors of the present invention has been concretely described based on the embodiments. However, it is needless to say that the present invention is not limited to the foregoing embodiments and various modifications and alterations can be made within the scope of the present invention.

Modification Example 1

Figure 16:
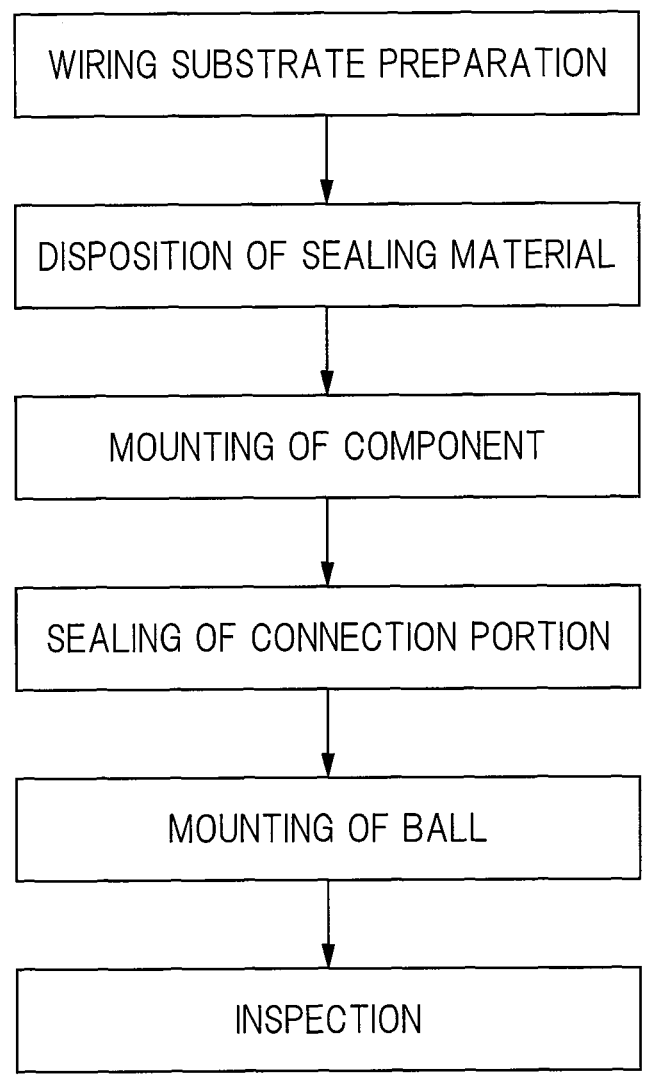
FIG. 16 is an explanatory diagram illustrating an overview of manufacturing steps of a semiconductor device which is a modification example of FIG. 13.
Figure 17:
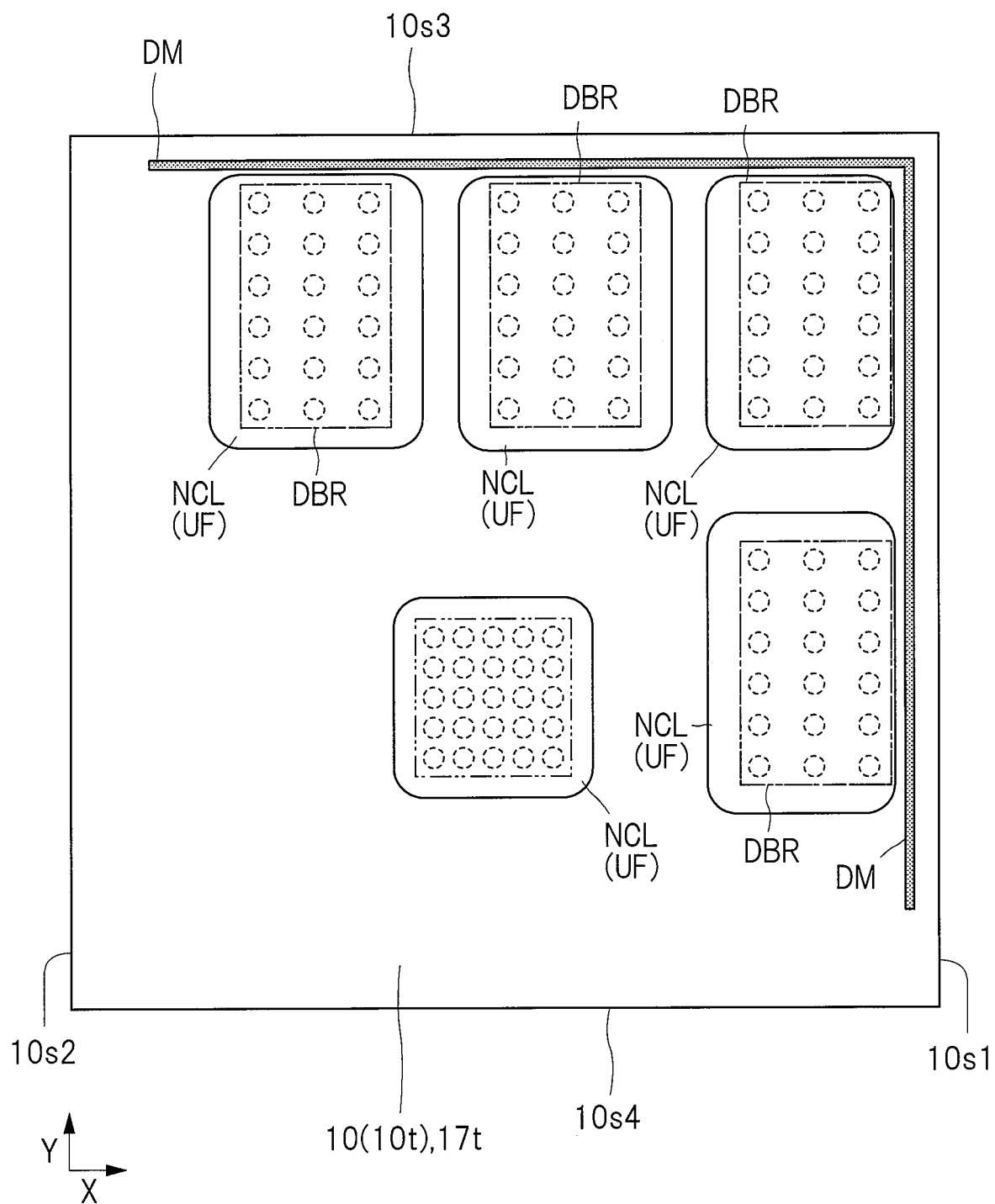
FIG. 17 is a plan view illustrating a state in which a resin material is disposed in a component mounting region in a sealing material disposing step illustrated in FIG. 16.

For example, in the above-described embodiment, the description has been given regarding the embodiment of the post-injection scheme in which the resin UF is supplied after the component mounting step as the method of disposing the resin UF to seal the connection portion which electrically connects the semiconductor component with the wiring substrate 10 in the connection portion sealing step. However, there are various types of modification examples regarding the sealing method of the connection portion. FIG. 16 is an explanatory diagram illustrating an overview of manufacturing steps of a semiconductor device which is a modification example of FIG. 13. FIG. 17 is a plan view illustrating a state in which a resin material is disposed in a component mounting region in a sealing material disposing step illustrated in FIG. 16. In addition, FIG. 18 is an enlarged cross-sectional view illustrating a state in which a semiconductor component is pressed from a rear surface side and is mounted over a wiring substrate in a component mounting step illustrated in FIG. 16.

A method of manufacturing the semiconductor device illustrated in FIG. 16 includes a sealing material disposing step prior to the component mounting step, which is different from the manufacturing method illustrated in FIG. 13. In the modification example 1, a sealing material NCL, which corresponds to the resin UF illustrated in FIG. 3, is disposed on each of the plurality of component mounting regions DBR, as illustrated in FIG. 17, in the sealing material disposing step. The sealing material NCL is an insulating resin material, and has a viscosity at a degree that enables retaining of a shape after being disposed on the component mounting region DBR. In addition, the sealing material NCL is made of a resin material of which hardness (degree of hardness) becomes hard (high) when energy is applied thereto, and contains a thermosetting resin, for example, in the modification example 1.

Figure 18:
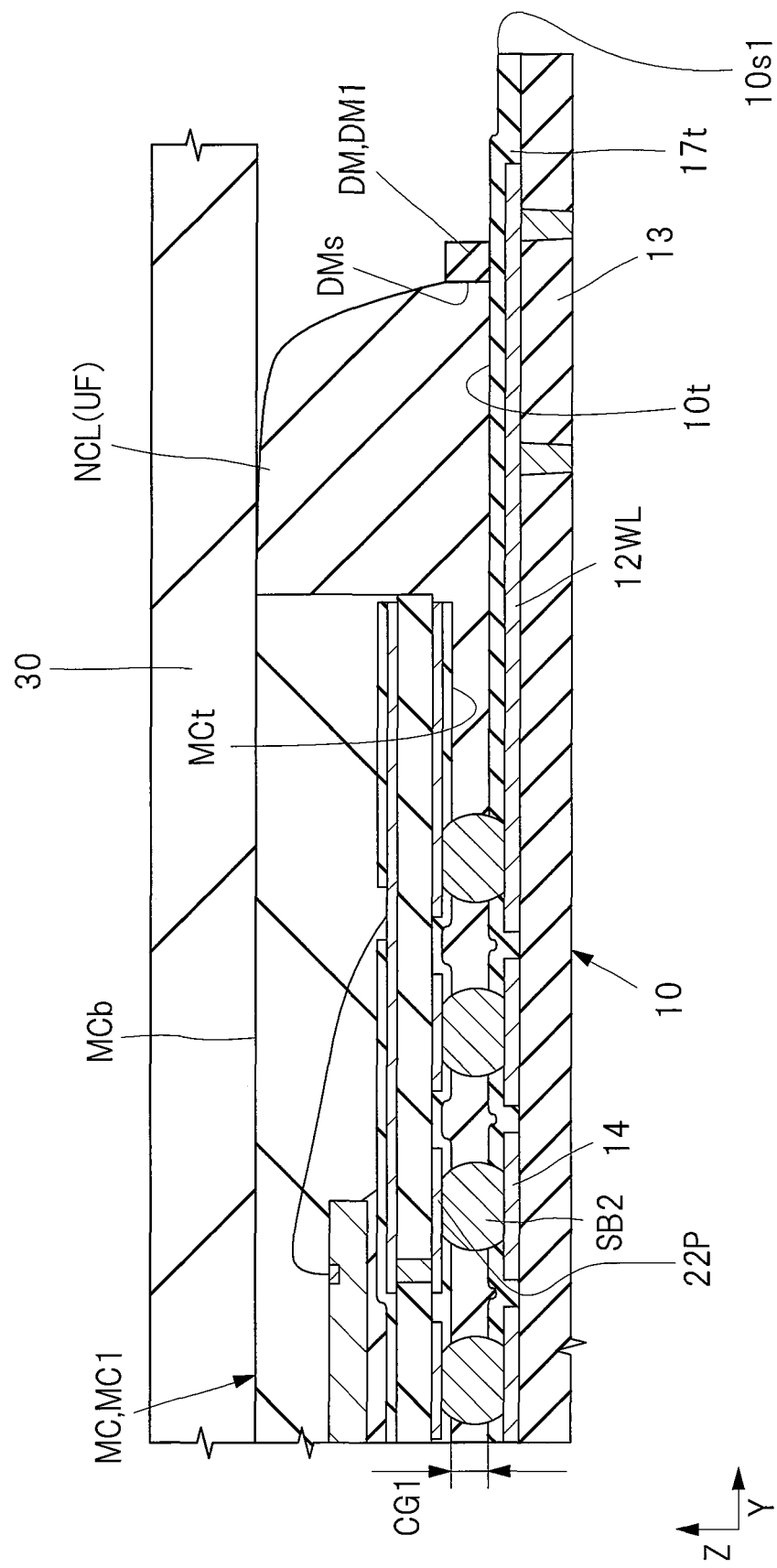
FIG. 18 is an enlarged cross-sectional view illustrating a state in which a semiconductor component is pressed from a rear surface side and is mounted over a wiring substrate in a component mounting step illustrated in FIG. 16.

In addition, in the modification example 1, a pressing jig 30 is brought into contact with the rear surface MCb of the semiconductor component (the memory component MC in the example illustrated in FIG. 18), and the semiconductor component is pressed toward the wiring substrate 10, as illustrated in FIG. 18, in the component mounting step illustrated in FIG. 16. In other words, the plurality of protruding electrodes SB2 of the semiconductor component and the plurality of bonding pads 14 of the wiring substrate 10 are electrically connected to each other by applying a load with respect to the sealing material NCL via the semiconductor component in the component mounting step according to the modification example 1.

In addition, the sealing material NCL is cured to form the resin UF which seals the connection portions formed by the plurality of protruding electrodes SB2 in the connection portion sealing step illustrated in FIG. 16 in the modification example 1.

A scheme in which the sealing material NCL is disposed in the component mounting region DBR, and then, the semiconductor component is pressed from above the sealing material NCL to be mounted as in the modification example 1, is distinguished from the above-described post-injection scheme, and called a pre-coating scheme (or a pre-disposition scheme).

In addition, the sealing material NCL before curing is roughly distinguished in the following two ways, depending on a difference in a handling method. The first one is a scheme in which the sealing material NCL is made of paste-like resin (insulating material paste), which is called a non-conductive paste (NCP), and is applied to the component mounting region DBR through a nozzle (not illustrated). The second one is a scheme in which the sealing material NCL is made of resin, which is molded like a film in advance (an insulating material film) film) and called a non-conductive film (NCF), is transported to the component mounting region DBR in the state of the film, and then is attached thereto.

When the insulating material paste (NCP) is used, the paste-like sealing material NCL spreads to the perimeter when the load is applied to the sealing material NCL in the component mounting step illustrated in FIG. 16. Thus, there is a possibility that, when the sealing material NCL spreads too much in the vicinity of the peripheral edge of the upper surface 10t of the wiring substrate 10, the sealing material NCL spreads beyond the peripheral edge of the upper surface 10t of the wiring substrate 10 and reaches the side surface, as with the resin UF described in the above-described embodiment.

Accordingly, when the technique that has been described in the above-described embodiment is applied, it is possible to suppress the spread of the paste-like sealing material NCL.

On the other hand, a shape retaining property of the insulating material film (NCF) is higher (that is, the viscosity is higher) than that of the insulating material paste (NCP). Thus, the degree of the spread in the component mounting step is low as compared to the case of using the paste-like sealing material NCL. However, the load is applied to the sealing material NCL before curing in the component mounting step in the case of the pre-coating scheme, as described above. Thus, it is preferable to apply the technique that has been described in the above-described embodiment, and to suppress the spread of the resin UF using the dam portion DM even in the case of using the insulating material film (NCF).

Modification Example 2

Figure 19:
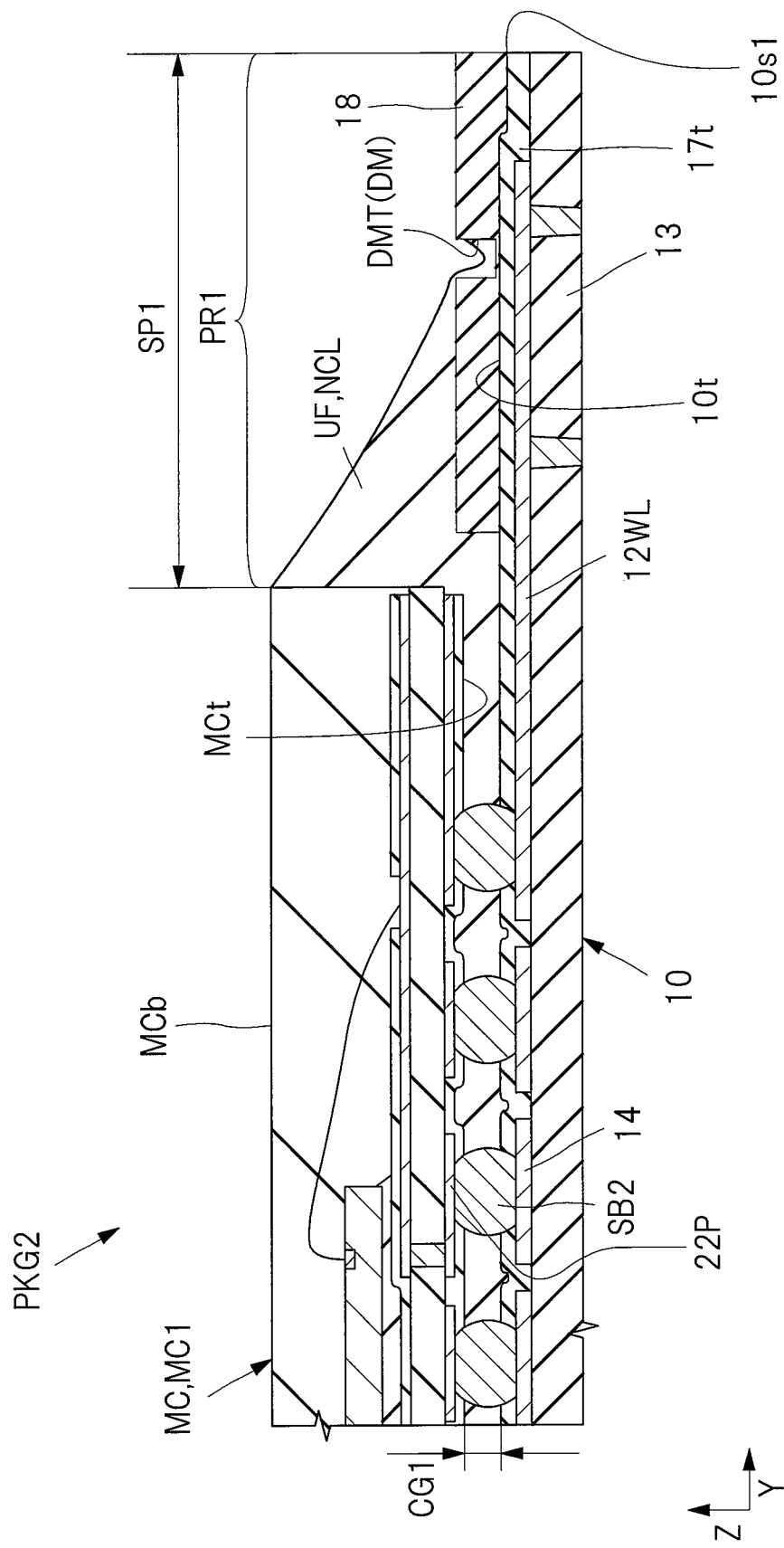
FIG. 19 is an enlarged cross-sectional view of a semiconductor device which is a modification example of FIG. 9.

In addition, the description has been given in the above-described embodiment using the dam portion DM, as an example of the dam portion DM, which is the wall (convex portion) formed to protrude on the insulating film 17t, as illustrated in FIG. 18. However, a groove pattern, which is formed on an insulating film 18 disposed on the insulating film 17t, may be used as the dam portion DM, like a dam portion DMT according to the modification example 2 illustrated in FIG. 19. FIG. 19 is an enlarged cross-sectional view of a semiconductor device which is a modification example of FIG. 9.

A semiconductor device PKG2 illustrated in FIG. 19 includes the insulating film 18 formed on the insulating film 17t of the wiring substrate 10, and the dam portion DMT as the groove pattern formed on the insulating film 18, which is different from the semiconductor device PKG1 illustrated in FIG. 9. Even when the resin UF does not completely remain in an edge of the groove pattern (an edge portion of the groove pattern) by surface tension, and flows into a groove, an inner wall of the dam portion DMT can suppress the further flow-out (proceeding to the outside) of the resin UF in the case of the dam portion DMT serving as the groove pattern.

For example, first, the insulating film 18, which is a resin film, is stacked on the insulating film 17t in a method of forming the dam portion DMT. The insulating film 18 may be a solder resist film, which is the same as the insulating film 17t, or may be a resin film having a different composition from that of the insulating film 17t.

In addition, a groove pattern may be formed on the insulating film 17t and used as the dam portion DMT as another modification example of FIG. 19. However, when a conductor pattern such as the wiring 12WL is disposed at a location overlapping the groove pattern in a thickness direction in this case, this conductor pattern is exposed from the insulating film 17t. Accordingly, the method of stacking the insulating film 18 is preferable from a point of view of protecting the conductor pattern.

Modification Example 3

In addition, for example, the layout of the semiconductor components of the semiconductor device PKG1 illustrated in FIG. 2, which has been described in the above-described embodiment, is an example of a case in which a few semiconductor components are disposed in the vicinity of the peripheral edge of the wiring substrate 10. Accordingly, there are various types of modification examples regarding the layout of the semiconductor components. For example, even when a semiconductor component is a single component, it is also possible that the semiconductor component is mounted to be close to a peripheral edge portion of a wiring substrate, for the reason such as a connection relationship with other electronic components. In this case, it is possible to suppress that the resin UF spreads to the peripheral edge of the wiring substrate by applying the technique that has been described in the above-described embodiment.

Figure 20:
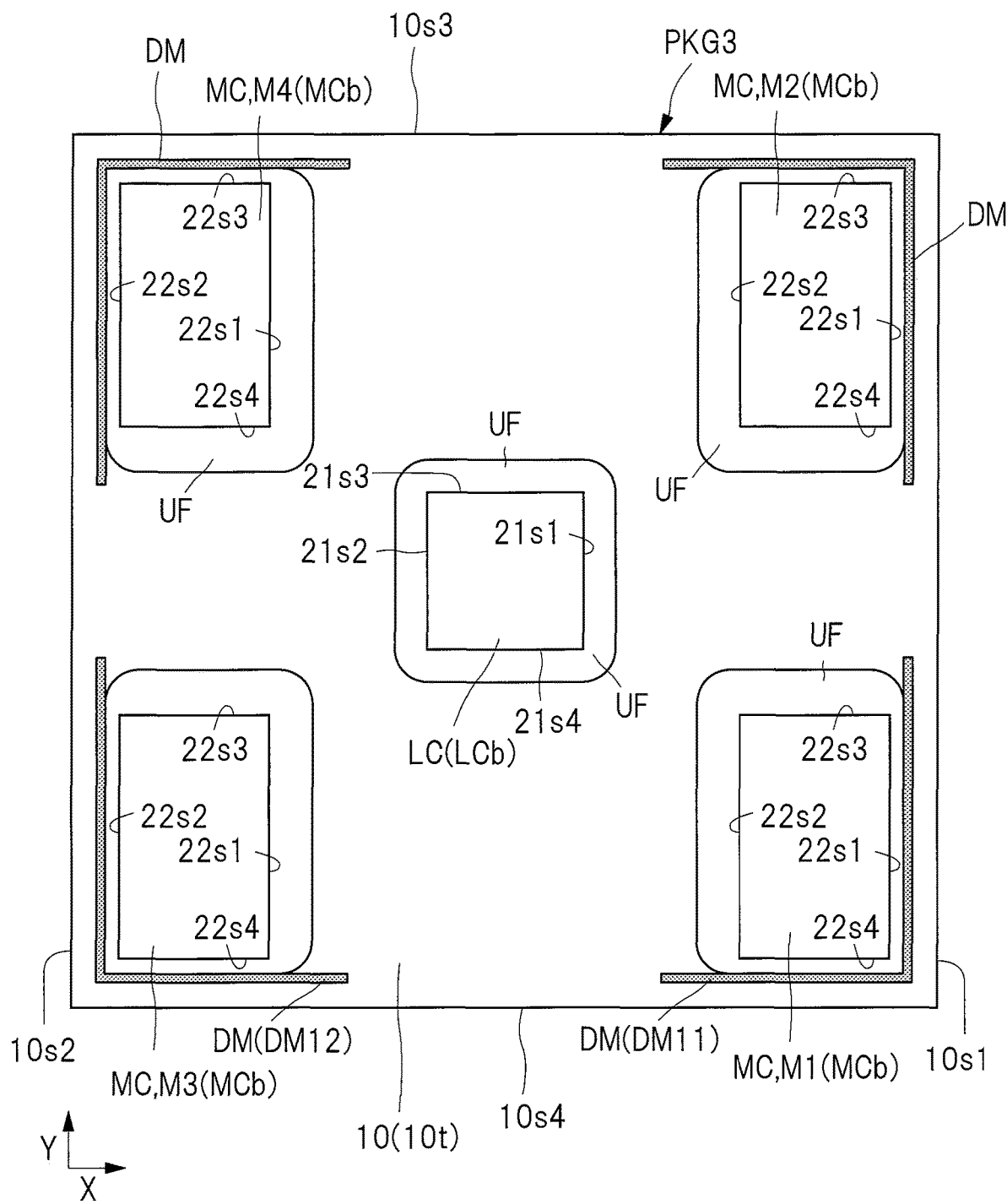
FIG. 20 is a plan view of a semiconductor device which is a modification example of FIG. 2.

In addition, for example, a modification example illustrated in FIG. 20 is possible, as a modification example of the semiconductor device including the logic component LC and the four memory components MC. FIG. 20 is a plan view of a semiconductor device which is a modification example of FIG. 2.

In a semiconductor device PKG3 illustrated in FIG. 20, the respective four memory components MC are mounted to be close to corners of the wiring substrate 10 having a quadrangle plane shape, and the logic component LC is mounted in the central portion of the upper surface 10t. In addition, the same structure as the dam portion DM, which is provided in the perimeter of the memory component M2 that has been described with reference to FIG. 10, is provided between each of the plurality of memory components MC and each substrate side forming the peripheral edge of the upper surface 10t of the wiring substrate 10. That is, the damportion DM including a first part (the dam portion DM2 illustrated in FIG. 10) which extends along the substrate side 10s1 and the substrate side 10s2, in other words, extends along the Y direction, and a second part (the dam portion DM3 illustrated in FIG. 10) which extends along the substrate side 10s3 and the substrate side 10s4, in other words, extends along the X direction, is disposed between each of the plurality of memory components MC and each substrate side of the peripheral edge of the upper surface 10t of the wiring substrate 10. The above-described first part and the above-described second part of the dam portion DM are linked to each other, and have an L-shaped plane shape. Incidentally, when seen in a plan view, each length of the respective parts (that is, the first part and the second part) is set to be longer than a length of each side of the respective memory components MC located to be adjacent to the respective parts. In this manner, it is possible to more reliably prevent the resin flowing out of the component mounting region from reaching the peripheral edge portion of the wiring substrate.

In addition, in the case of the semiconductor device PKG3, the memory component M1 and the memory component M3 are disposed between the substrate side 10s1 and the substrate side 10s2 such that the memory component M1 and the memory component M3 are arranged side by side along the substrate side 10s4. In addition, the memory component M2 and the memory component M4 are disposed between the substrate side 10s1 and the substrate side 10s2 such that the memory component M2 and the memory component M4 are arranged side by side along the substrate side 10s3. In addition, the memory component M1 and the memory component M2 are disposed between the substrate side 10s3 and the substrate side 10s4 such that the memory component M1 and the memory component M2 are arranged side by side along the substrate side 10s1. The memory component M3 and the memory component M4 are disposed between the substrate side 10s3 and the substrate side 10s4 such that the memory component M3 and the memory component M4 are arranged side by side along the substrate side 10s2.

In addition, each distance among the plurality of memory components MC is larger than a distance between each of the plurality of memory components MC and each substrate side which is the closest to each of the memory components MC. Thus, the dam portion DM is not provided among the plurality of memory components MC. Thus, it is possible to suppress that the resin UF, which is disposed between each of the memory components MC and the wiring substrate 10, climbs over each of the dam portions DM.

In addition, the memory component MC is not disposed between the logic component LC and each substrate side. Thus, a space in which a wiring path to be connected to the logic component LC is disposed is secured in the perimeter of the logic component LC.

In addition, the configuration of the semiconductor device PKG3 illustrated in FIG. 20 can be described as follows. That is, the memory component M1 is mounted between the substrate side 10s1 and the substrate side 10s2, and the memory component M3 is mounted between the memory component M1 and the substrate side 10s2, in the upper surface 10t of the wiring substrate 10 provided in the semiconductor device PKG3. In addition, a distance between the memory component M1 and the substrate side 10s1 is smaller than a distance between the memory component M1 and the memory component M3. In addition, a distance between the memory component M3 and the substrate side 10s2 is smaller than the distance between the memory component M1 and the memory component M3. In addition, the dam portion DM is formed each between the memory component M1 and the substrate side 10s1, and between the memory component M3 and the substrate side 10s2, but is not formed between the memory component M1 and the memory component M3.

The configuration of the semiconductor device PKG3 illustrated in FIG. 20 can be described as follows. That is, each of the memory component M1 and the memory component M3 is mounted between the substrate side 10s4 and the substrate side 10s3 in the upper surface 10t of the wiring substrate 10 provided in the semiconductor device PKG3. In addition, a distance between the memory component component M1 and the substrate side 10s4 is smaller than a distance between the memory component M1 and the substrate side 10s3. In addition, a distance between the memory component M3 and the substrate side 10s4 is smaller than a distance between the memory component M3 and the substrate side 10s3. In addition, a dam portion DM11 among the dam portions DM is formed between the memory component M1 and the substrate side 10s4. In addition, a dam portion DM12 among the dam portions DM is formed between the memory component M3 and the substrate side 10s4. Further, the distance between the two memory components M1 and M3 adjacent to each other is larger than a dimension (to be specific, a length of "long side") of a single memory component, as described above, and thus, the dam portion DM11 and the dam portion DM12 are separated from each other. In other words, it is unnecessary to link the dam portion DM11 to the dam portion DM12. Although the description has been given by exemplifying the memory components M1 and M3, the above-described layout is common in a relationship between the memory component M1 and the memory component M2, a relationship between the memory component M2 and the memory component M4, and further, a relationship between the memory component M3 and the memory component M4, and the redundant description thereof will be omitted.

Modification Example 4

In addition, the description has been given by exemplifying the flip-chip connection scheme as a method of mounting the semiconductor component over the wiring substrate and electrically connecting the semiconductor component to the wiring substrate in the above-described embodiment. However, a semiconductor component may be mounted over a wiring substrate in a state in which a rear surface opposite to an electrode disposition surface of the semiconductor component is opposite to an upper surface of the wiring substrate, as a modification example.

Such a mounting method is referred to as a face-up mounting scheme, and and the wiring substrate 22WS and the semiconductor component (the semiconductor chip 22) are electrically connected to each other via a wire BW as in the example illustrated in FIG. 7, for example. In addition, the semiconductor component is mounted over the wiring substrate 22WS via an adhesive 22DB in the case of the face-up mounting scheme. This adhesive 22DB is obtained by curing a paste-like resin material including, for example, a thermosetting resin. Accordingly, when the semiconductor chip 22 (the semiconductor component) illustrated in FIG. 7 is mounted in the vicinity of the peripheral edge of the wiring substrate 22WS, it is possible that the adhesive 22DB spreads to the perimeter of the wiring substrate 22WS.

In this case, it is possible to suppress that the adhesive 22DB spreads to a side surface of the wiring substrate 22WS by applying the technique that has been described in the above-described embodiment.

Modification Example 5

Figure 21:
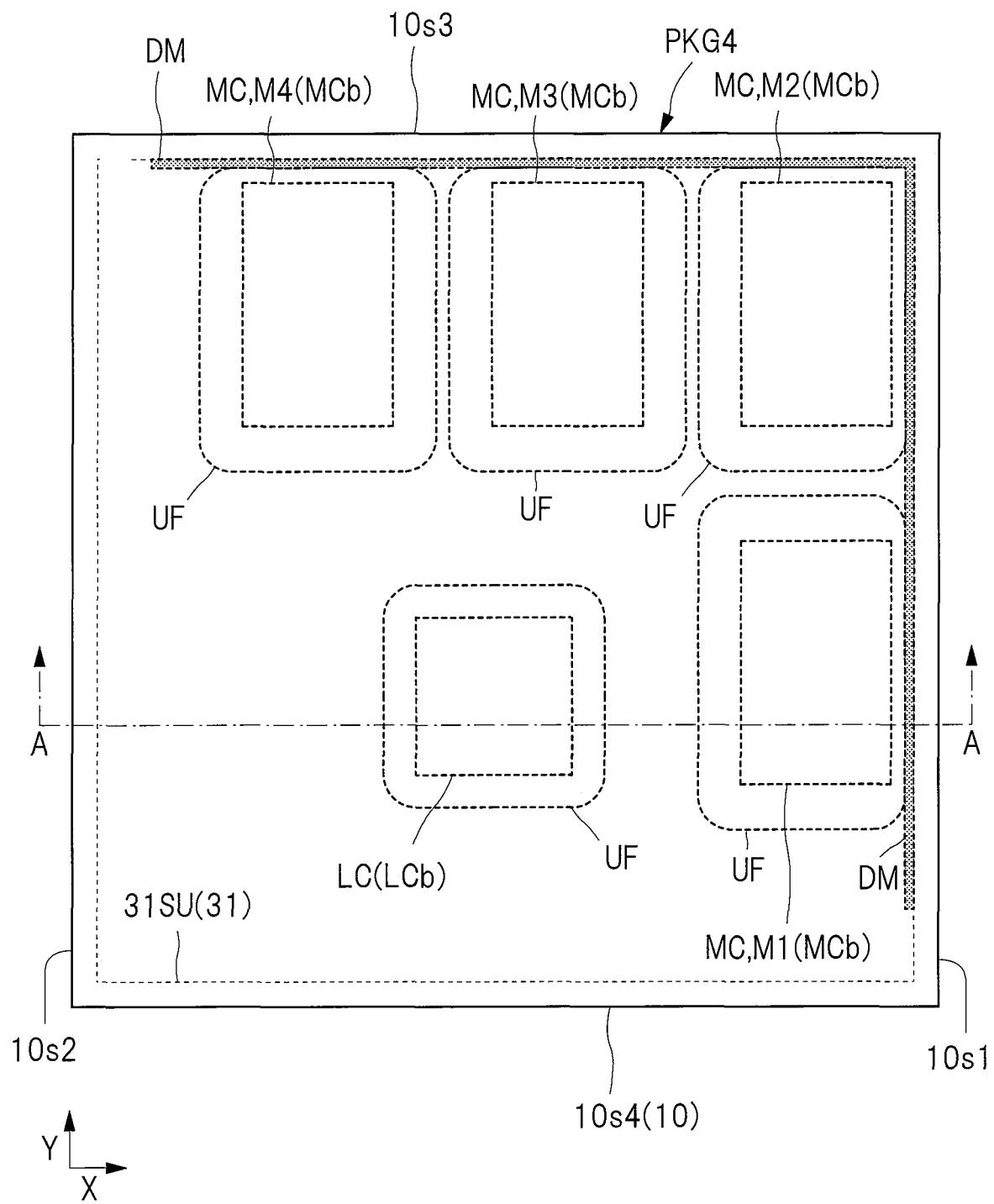
FIG. 21 is a top view of a semiconductor device which is a modification example of FIG. 2.

In addition, the description has been given in the above-described embodiment and the respective modification examples in which the plurality of semiconductor components, mounted over the upper surface 10t of the wiring substrate 10, are exposed without being covered by another member such as a cover member or a heat dissipation member. However, a semiconductor component may be covered by another member, as in a semiconductor device PKG4 illustrated in FIG. 21. FIG. 21 is a top view of a semiconductor device which is a modification example of FIG. 2. In addition, FIG. 22 is a cross-sectional view taken along a line A-A of FIG. 21.

Incidentally, FIG. 21 illustrates each contour of the semiconductor component, the resin UF, the dam portion DM, and a support portion 31SU of a member 31 using dotted lines in order to illustrate each mutual relationship in planar locations of the semiconductor component, the resin UF, the dam portion DM, and the member 31. In addition, FIG. 22 is the cross-sectional view, but hatching is omitted in the insulating layer 13, the insulating film 17t, the insulating film 17b, and the resin UF in order for convenience of viewing of the drawing.

Figure 22:
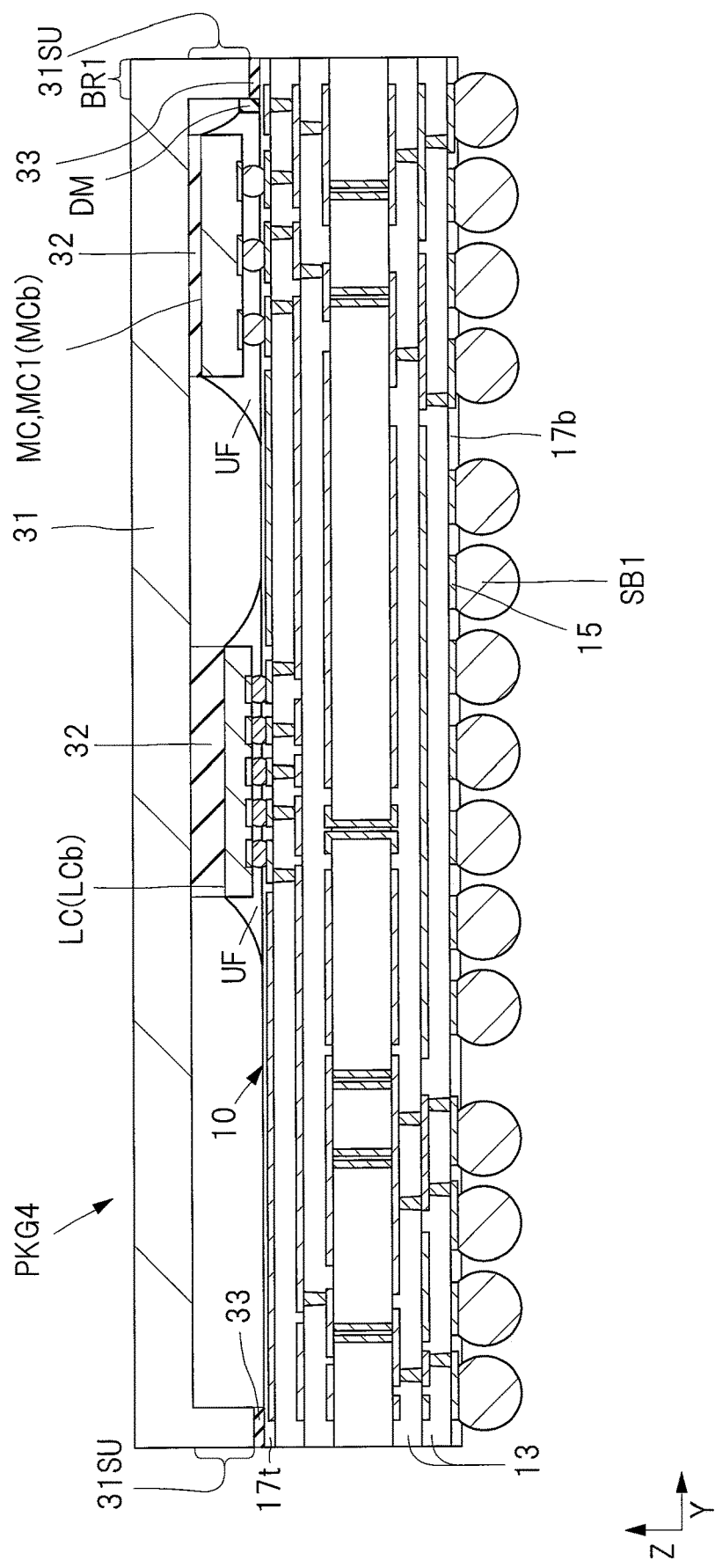
FIG. 22 is a cross-sectional view taken along a line A-A of FIG. 21.

The semiconductor component PKG4 illustrated in FIGS. 21 and 22 is different from the semiconductor device PKG 1 illustrated in FIGS. 2 and 3 in that the member 31 is attached so as to cover the entire rear surface of each of the plurality of semiconductor components.

The member 31 illustrated in FIGS. 21 and 22 is a heat dissipation member (heat dissipation fin) which releases the heat stored in the semiconductor components (the logic component LC and the memory component MC) to the outside. The member 31 is attached to the rear surface LCb of the logic component LC and the rear surface MCb of the memory component MC via an adhesion layer 32 (see FIG. 22). The larger the area of the heat dissipation fin is, the higher the heat dissipation efficiency of the member 31 is. Thus, the member 31 covers the entire rear surface of each of the plurality of semiconductor components, and further, the area of the member 31 is larger than the area of each rear surface of the plurality of semiconductor components when seen in a plan view, in the example illustrated in FIG. 21. In the example illustrated in FIG. 21, the area of the member 31 is equal to the area of the upper surface 10t of the wiring substrate 10 (see FIG. 22), and is larger than a sum of the areas of the respective rear surfaces of the plurality of semiconductor components. Incidentally, a clearance between the memory component MC and the upper surface 10t of the wiring substrate 10 is larger than a clearance between the logic component LC and the upper surface 10t of the wiring substrate 10, as illustrated in FIG. 22. In other words, amounting height of the memory component MC (a distance from the upper surface 10t of the wiring substrate 10 to the rear surface MCb of the memory component MC) is greater than a mounting height of the logic component LC (a distance from the upper surface 10t of the wiring substrate 10 to the rear surface LCb of the logic component LC). Thus, the member 31 may be attached only to the rear surface MCb of the memory component MC via the adhesion layer 32.

When the member having the area nearly equal to the wiring substrate is mounted over the wiring substrate 10 in this manner, it is preferable that the member 31 includes the support portion 31SU from a point of view of improving fixing strength of the member 31. In the example illustrated in FIG. 21, the support portion 31SU is a frame-like portion provided in a peripheral edge portion of the member 31, and is formed to be integrated with a portion (main body portion) that covers the plurality of semiconductor components. However, the support portion 31SU may be formed as a separate member from the above-described main body portion.

In addition, the member 31 is supported by the semiconductor component near the central portion of the upper surface 10t of the wiring substrate 10 (see FIG. 22), and thus, it is preferable to attach the support portion 31SU to the peripheral edge portion of the member 31. In the case of the modification example 5, the support portion 31SU is attached to the peripheral edge portion including the respective substrate sides forming the peripheral edge of the upper surface 10t of the wiring substrate 10 via an adhesive 33, as illustrated in FIG. 22. The above-described peripheral edge portion includes a region BR1 located between the dam portion DM and the substrate side 10s1.

Here, when the resin UF spreads to the peripheral edge of the upper surface 10t of the wiring substrate 10 (see FIG. 22) as described in the above-described embodiment, the flatness of the region BR1 deteriorates. In this case, the flatness of an adhesion surface of the support portion 31SU deteriorates, and thus, it is difficult to fix the member 31 to be parallel to the wiring substrate 10.

Incidentally, the member 31 is attached to the rear surface LCb of the logic component LC and the rear surface MCb of the memory component MC via the adhesion layer 32 (see FIG. 22), as illustrated in FIG. 22. The adhesion layer 32 is a resin film having an improved thermal conductive property by containing multiple particles with high thermal conductivity, for example, metal particles or the like, and has lower elasticity than the member 31. Thus, the semiconductor component and the member 31 can be connected by allowing the adhesion layer 32 to be interposed therebetween even in a case in which the member 31 is not completely parallel to the wiring substrate 10.

However, when the resin UF spreads to an adhesion region of the support portion 31SU, and the flatness deteriorates, the inclination of the member 31 with respect to the wiring substrate 10 increases, and thus, there is a risk that the member 31 and the adhesion layer 32, or the semiconductor component and the adhesion layer 32 are not in contact with each other.

In this case, the reduction of the heat dissipation property of the semiconductor component is caused. In particular, the power consumption is greater in the logic component LC than in the memory component MC, and thus, an amount of the heat generation is also large in the logic component LC. Further, when a heat dissipation path passing through the logic component LC, the adhesion layer 32, and the member 31 is decoupled, and the heat dissipation efficiency deteriorates, there is a possibility that the operation of the logic component LC becomes unstable.

However, when the technique that has been described in the above-described embodiment is applied, it is possible to suppress that the resin UF spreads to the peripheral edge portion of the upper surface 10t of the wiring substrate 10 including the region BR1 illustrated in FIG. 22. As a result, the flatness of the adhesion surface of of the support portion 31SU is improved, and thus, it is possible to reliably connect the plurality of semiconductor components including the logic component LC with the member 31.

Meanwhile, when the member 31 is mounted over the wiring substrate as in the modification example 5, it is performed between the connection portion sealing step and the ball mounting step, or between the ball mounting step and the inspection step illustrated in FIGS. 13 and 16.

Here, when the dam portion DM is continuously formed along the respective four substrate sides forming the peripheral edge of the upper surface 10t (see FIG. 22) of the wiring substrate 10 illustrated in FIG. 21, the dam portion DM and the support portion 31SU are brought into contact with each other unless the support portion 31SU of the member 31 and the wiring substrate 10 are aligned with high accuracy.

According to the modification example 5, the dam portion DM is provided between the substrate side 10s2 and the semiconductor component and between the substrate side 10s4 and the semiconductor component. Thus, it is possible to easily avoid that the support portion 31SU of the member 31 is in contact with the dam portion DM at the time of attaching the member 31 to the wiring substrate 10.

In addition, the dam portion DM is not provided more than necessary, and thus, it is possible to improve the adhesion area between the support portion 31SU of the member 31 and the wiring substrate 10. In this manner, it is possible to widen the heat dissipation path from the respective components to the member 31 passing through the wiring substrate 10, and as a result, it is possible to further improve the heat dissipation efficiency. In particular, when the member 31 is not attached to the logic component LC via the adhesion layer 32, and further, when it is desired to transfer (move) the heat generated in the logic component LC to the member 31 as much as possible, it is preferable to provide the large support portion 31SU in the member 31, and to improve the adhesion area between the wiring substrate 10 and the support portion 31SU.

Modification Example 6

In addition, the description has been given regarding the various types of modification examples as above, for example, but the respective modification examples described above can be applied in a combined manner.

In addition, some of the contents that have been described in the above-described embodiment will be described hereinafter.

Appendix 1

A method of manufacturing a semiconductor device, the method including the steps of:

(a) preparing a wiring substrate including a first surface, a first insulating film formed on the first surface, and a first dam portion formed on the first insulating film;

(b) mounting a first semiconductor component over the first surface of the wiring substrate; and (c) disposing a first resin between the first insulating film and the first semiconductor component, wherein the first surface includes a first side, and a second side opposite to the first side, wherein the first semiconductor component is mounted over the first surface of the wiring substrate in the step (b) such that a distance between the first semiconductor component and the first side is smaller than a distance between the first semiconductor component and the second side when seen in a plan view, and wherein the first dam portion is formed between the first semiconductor component and the first side, but is not formed between the first semiconductor component and the second side.

Appendix 2

A method of manufacturing a semiconductor device, the method including the steps of:

(a) preparing a wiring substrate including a first surface, a first insulating film formed on the first surface, and a first dam portion formed on the first insulating film;

(b) disposing a first resin over the first surface of the wiring substrate; and (c) pressing a first semiconductor component on the first resin, and mounting the first semiconductor component over the wiring substrate, wherein the first surface includes a first side, and a second side opposite to the first side, wherein the first semiconductor component is mounted over the first surface of the wiring substrate in the step (b) such that a distance between the first semiconductor component and the first side is smaller than a distance between the first semiconductor component and the second side when seen in a plan view, and wherein the first dam portion is formed between the first semiconductor component and the first side, but is not formed between the first semiconductor component and the second side.

Appendix 3

A semiconductor device including:

a wiring substrate including a first surface, a first insulating film formed on the first surface, and a dam portion formed on the first insulating film;

a first semiconductor component and a second semiconductor component mounted over the first surface of the wiring substrate;

a first resin located between the first insulating film and the first semiconductor component; and a second resin located between the first insulating film and the second semiconductor component, wherein the first surface includes a first side, and a second side opposite to the first side, wherein the first semiconductor component is mounted between the first side and the second side in the first surface, and the second semiconductor component is mounted between the first semiconductor component and the second side in the first surface, wherein a distance between the first semiconductor component and the first side is smaller than a distance between the first semiconductor component and the second semiconductor component, wherein a distance between the second semiconductor component and the second side is smaller than a distance between the first semiconductor component and the second semiconductor component, and wherein the dam portion is formed each between the first semiconductor component and the first side and between the second semiconductor component and the second side, but is not formed between the first semiconductor component and the second semiconductor component.

Appendix 4

A semiconductor device including:
a wiring substrate including a first surface, a first insulating film formed on the first surface, and dam portions formed on the first insulating film;
a first semiconductor component and a second semiconductor component mounted over the first surface of the wiring substrate;
a first resin located between the first insulating film and the first semiconductor component; and
a second resin located between the first insulating film and the second semiconductor component,
wherein the first surface includes a first side, and a second side opposite to the first side,
wherein each of the first semiconductor component and the second semiconductor component is mounted between the first side and the second side in the first surface,
wherein a distance between the first semiconductor component and the first side is smaller than each of a distance between the first semiconductor component and the second side, and a distance between the first semiconductor component and the second semiconductor component,
wherein a distance between the second semiconductor component and the first side is smaller than each of a distance between the second semiconductor component and the second side, and a distance between the first semiconductor component and the second semiconductor component,
wherein a distance between the first semiconductor component and the second semiconductor component is larger than a dimension of one of the first semiconductor component and the second semiconductor component,
wherein a first dam portion of the dam portions is formed between the first semiconductor component and the first side,
wherein a second dam portion of the dam portions is formed between the second semiconductor component and the first side, and
wherein the first dam portion is separated from the second dam portion.

What is claimed is:
1. A semiconductor device comprising:
a wiring substrate including a first surface, a first insulating film formed on the first surface, and a dam portion formed on the first insulating film;
a first semiconductor component mounted over the first surface of the wiring substrate;
a second semiconductor component mounted over the first surface of the wiring substrate, and spaced apart from the first semiconductor component in a plan view;
a third semiconductor component mounted over the first surface of the wiring substrate, and spaced apart from each of the first semiconductor component and the second semiconductor component in the plan view;
a first resin located directly between the first insulating film, which is located on a first component mounting region of the first surface over where the first semiconductor component is mounted, and the first semiconductor component,
a second resin located directly between the first insulating film, which is located on a second component mounting region of the first surface over where the second semiconductor component is mounted, and the second semiconductor component, and
a third resin located directly between the first insulating film, which is located on a third component mounting region of the first surface over where the third semiconductor component is mounted, and the third semiconductor component,
wherein, in the plan view the first surface of the wiring substrate includes:
a first side extending in a first direction,
a second side extending in the first direction and opposite to the first side,
a third side extending in a second direction crossing to the first direction, and intersecting with each of the first side and the second side, and
a fourth side extending in the second direction opposite to the third side and intersecting with each of the first side and the second side,
wherein, in the plan view, the first semiconductor component and the second semiconductor component are arranged along the first side of the first surface of the wiring substrate, and arranged next to each other,
wherein, in the second direction, each of the first semiconductor component and the second semiconductor component is located closer to the first side of the first surface of the wiring substrate than the third semiconductor component,
wherein the distance between each of the first semiconductor component and the second semiconductor component and the first side is smaller than the distance between the third semiconductor component and the second side,
wherein the first side has a first portion located next to the first component mounting region in the second direction, and a second portion located next to the second component mounting region in the second direction,
wherein, in the plan view, the first surface of the wiring substrate has a first peripheral region located between each of the first semiconductor component and the second semiconductor component and the first side,
wherein the first peripheral region has a first peripheral portion located between the first component mounting region and the first portion of the first side in the second direction, and a second peripheral portion located between the second component mounting region and the second portion of the first side in the second direction,
wherein at least each of the first peripheral portion and the second peripheral portion, in the first surface of the wiring substrate, is covered with the first insulating film,
wherein, in the plan view, the dam portion is continuously formed between each of the first semiconductor component and the second semiconductor component and the first side from at least an end of the first semiconductor component closest to the fourth side to at least an end of the second semiconductor component closest to the third side, wherein the dam portion is not formed between the first semiconductor component and the second semiconductor component, and wherein the dam portion is not formed between the third semiconductor device and the second side, and
wherein the first resin, the second resin and the third resin substantially cover each side surface of the first semiconductor component, the second semiconductor component and the third semiconductor component, respectively, and the first resin and the second resin are in contact with the dam portion.

2. The semiconductor device according to claim 1, wherein each of the distance between the first semiconductor component and the first side and the distance between the first semiconductor component and the third side is smaller than the distance between the first semiconductor component and the second side, and wherein the dam portion has a first dam portion formed between the first semiconductor component and the first side, and a second dam portion formed between the first semiconductor component and the third side.

3. The semiconductor device according to claim 2, wherein the distance between the first semiconductor component and the third side is equal to the distance between the first semiconductor component and the first side.

4. The semiconductor device according to claim 1, wherein the third semiconductor component controls each of the first semiconductor component and the second semiconductor component.

5. The semiconductor device according to claim 1, wherein each of a clearance between the first semiconductor component and the first surface of the wiring substrate and a clearance between the second semiconductor component and the first surface of the wiring substrate is larger than a clearance between the third semiconductor component and the first surface of the wiring substrate.

6. The semiconductor device according to claim 1, wherein each of the first semiconductor component and the second semiconductor component is mounted over the wiring substrate via a bump electrode.

7. The semiconductor device according to claim 1, wherein the dam portion is comprised of a resin film.

* * * * *